(12) United States Patent
Kachi et al.

(10) Patent No.: US 10,727,105 B2
(45) Date of Patent: Jul. 28, 2020

(54) SEMICONDUCTOR DEVICE AND MANUFACTURING METHOD THEREFOR

(71) Applicant: Renesas Electronics Corporation, Tokyo (JP)

(72) Inventors: Tsuyoshi Kachi, Ibaraki (JP); Yoshinori Hoshino, Ibaraki (JP); Senichirou Nagase, Ibaraki (JP)

(73) Assignee: RENSAS ELECTRONICS CORPORATION, Tokyo (JP)

( * ) Notice: Subject to any disclaimer, the term of this patent is extended or adjusted under 35 U.S.C. 154(b) by 42 days.

(21) Appl. No.: 15/592,241

(22) Filed: May 11, 2017

(65) Prior Publication Data

US 2018/0019160 A1    Jan. 18, 2018

(30) Foreign Application Priority Data

Jul. 14, 2016   (JP) .................................. 2016-139419

(51) Int. Cl.
*H01L 21/762* (2006.01)
*H01L 21/265* (2006.01)
(Continued)

(52) U.S. Cl.
CPC .. *H01L 21/76237* (2013.01); *H01L 21/26586* (2013.01); *H01L 29/0634* (2013.01);
(Continued)

(58) Field of Classification Search
CPC ................................ H01L 21/823807–823814
See application file for complete search history.

(56) References Cited

U.S. PATENT DOCUMENTS 6,307,246 B1   10/2001   Nitta et al.
6,331,466 B1 *  12/2001   Takahashi ............. H01L 25/072
                                                    438/268
(Continued)

FOREIGN PATENT DOCUMENTS

JP    2002-124675 A    4/2002
JP    4090518          5/2008
(Continued)

OTHER PUBLICATIONS

Japanese Office Action received in corresponding Japanese Application No. 2016-139419 dated Sep. 17, 2019.

*Primary Examiner* — Dale E Page
*Assistant Examiner* — Wilner Jean Baptiste
(74) *Attorney, Agent, or Firm* — Mattingly & Malur, PC

(57) ABSTRACT

Provided are a semiconductor device and a manufacturing method therefor that can prevent the breakage of an element and in which the control of impurity amounts is less susceptible to variations in manufacturing processes. A semiconductor substrate has a front surface and includes hole portions extending from the front surface to an inside of the substrate. N-type regions are formed in the semiconductor substrate. At wall surfaces of the hole portions, p-type regions are formed to configure p-n junction with the n-type regions. Each of the p-type regions includes a low-concentration region and a high-concentration region formed at the wall surface of each hole portion. A width of the high-concentration region along the wall surface of the hole portion becomes smaller from the front surface toward a deeper position.

7 Claims, 41 Drawing Sheets

(51) Int. Cl.
    *H01L 29/423*     (2006.01)
    *H01L 29/06*     (2006.01)
    *H01L 29/861*     (2006.01)
    *H01L 29/66*     (2006.01)
    *H01L 29/15*     (2006.01)
    *H01L 29/739*     (2006.01)
    *H01L 29/78*     (2006.01)

(52) U.S. Cl.
    CPC ...... *H01L 29/0649* (2013.01); *H01L 29/0688* (2013.01); *H01L 29/0696* (2013.01); *H01L 29/157* (2013.01); *H01L 29/158* (2013.01); *H01L 29/4236* (2013.01); *H01L 29/66348* (2013.01); *H01L 29/66734* (2013.01); *H01L 29/7397* (2013.01); *H01L 29/7813* (2013.01); *H01L 29/861* (2013.01)

(56) References Cited

U.S. PATENT DOCUMENTS

| | | | |
|---|---|---|---|
| 9,209,249 B2 | 12/2015 | Kachi | |
| 2002/0070418 A1* | 6/2002 | Kinzer | H01L 29/0634 257/496 |
| 2002/0185705 A1* | 12/2002 | Saitoh | H01L 21/3247 257/492 |
| 2006/0284248 A1* | 12/2006 | Saito | H01L 29/0634 257/341 |
| 2013/0082323 A1 | 4/2013 | Xiao | |

FOREIGN PATENT DOCUMENTS

| | | |
|---|---|---|
| JP | 2014-154596 A | 8/2014 |
| WO | 2013/161116 A1 | 10/2013 |

* cited by examiner

SEMICONDUCTOR DEVICE AND MANUFACTURING METHOD THEREFOR

CROSS-REFERENCE TO RELATED APPLICATIONS

The disclosure of Japanese Patent Application No. 2016-139419 filed on Jul. 14, 2016 including the specification, drawings and abstract is incorporated herein by reference in its entirety.

BACKGROUND

The present invention relates to semiconductor devices and manufacturing methods therefor.

Japanese Patent Publication No. 4090518 (Patent Document 1), Japanese Unexamined Patent Application Publication No. 2014-154596 (Patent Document 2), and the like have proposed a technique for forming a superjunction structure (SJ structure) by introducing impurities into side surfaces of trenches formed in a semiconductor substrate by ion implantation.

Such a method is low in process cost, as compared to a method (multi-epitaxial method) that includes a plurality of repetitions of epitaxial growth of silicon (Si) and ion implantation, or a method (trench-fill method) that includes filling trenches with an epitaxial layer of silicon. In the methods described in Patent Documents 1 and 2, the ratio between the amounts of n-type impurities and p-type impurities are constant at any position in the depth direction of the trench. Thus, the electric field intensity distribution becomes uniform in the depth direction of the trench, so that a high breakdown voltage can be achieved.

Japanese Unexamined Patent Application Publication No. 2002-124675 (Patent Document 3) discloses a method for achieving impurity distribution that is inclined in the depth direction through ion implantation by changing an inclination angle of the side surface of the trench in the depth direction.

RELATED ART DOCUMENTS

Patent Documents

Patent Document 1: Japanese Patent Publication No. 4090518

Patent Document 2: Japanese Unexamined Patent Application Publication No. 2014-154596

Patent Document 3: Japanese Unexamined Patent Application Publication No. 2002-124675

SUMMARY

In the techniques described in Patent Documents 1 and 2, a uniform electric field intensity distribution is obtained in the depth direction of the trench as mentioned above. However, in the uniform electric field intensity distribution, small variations in the amount of impurities disadvantageously reduce the breakdown voltage significantly. At a ratio between the p-type and n-type impurity amounts to achieve the highest breakdown voltage, only a small current flowing through the element in an avalanche breakdown disadvantageously leads to breakage of the element.

These problems can be handled by setting an impurity concentration distribution to be inclined in the depth direction of the trench, as described in Patent Document 3. However, to control the amount of impurities by the method described in Patent Document 3, the shape of the trench, such as the width of a trench opening or an inclination angle of the side surface of the trench, needs to be precisely controlled. Thus, the control of the impurity amount by the method of Patent Document 3 is disadvantageously susceptible to variations in the manufacturing processes.

Other problems and new features of the present invention will be clearly understood by the following detailed description in connection with the accompanying drawings.

In a semiconductor device according to one aspect of the invention, a semiconductor substrate has a front surface and includes a hole portion that extends from the front surface into an inside of the semiconductor substrate. A first impurity region of a first conductive type is formed in the semiconductor substrate. A second impurity region of a second conductive type that forms p-n junction with the first impurity region is formed at an inner wall surface of the hole portion. The second impurity region includes a low-concentration region and a high-concentration region which are of the first conductive type and are formed at the inner wall surface of the hole portion. A width of the high-concentration region along the inner wall surface of the hole portion becomes smaller from the front surface toward a deeper position.

The one aspect of the invention can achieve the semiconductor device and manufacturing method therefor that can prevent the breakage of the element and in which control of the amount of impurities is less susceptible to variations in the manufacturing processes.

DETAILED DESCRIPTION

Embodiments will be described below with reference to the accompanying drawings.

First Embodiment

First, the structure of a power MOSFET in a chip state will be described below as a semiconductor device in this embodiment with reference to FIG. 1.

Figure 1:
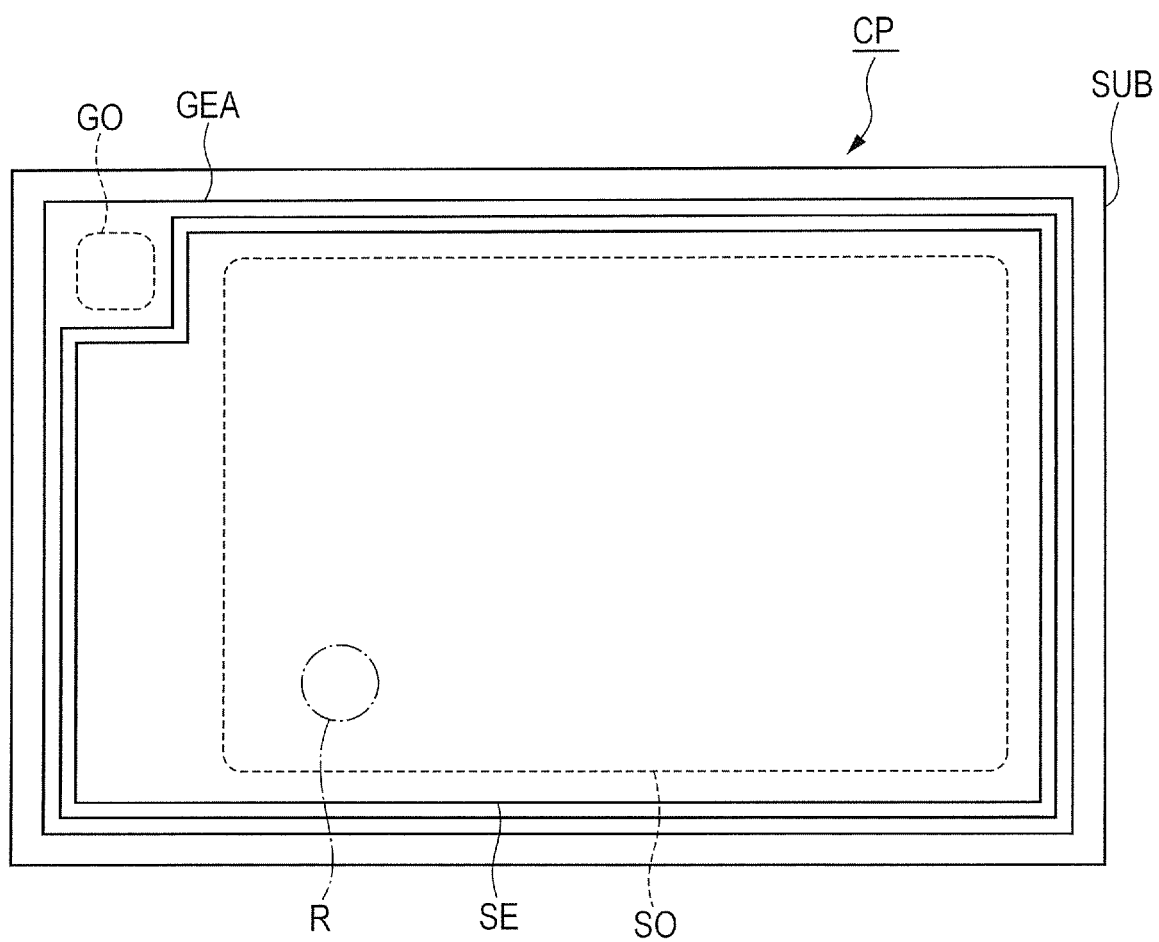
FIG. 1 is a schematic plan view showing the structure of a power metal oxide semiconductor field effect transistor (MOSFET) as a semiconductor device in a first embodiment.

As shown in FIG. 1, a semiconductor device CP in this embodiment is, for example, the power MOSFET in the chip state. A gate wiring GEA and a source electrode SE are arranged over a semiconductor substrate SUB. A protective insulating film (made of polyimide (not shown) and the like) is formed to cover the gate wiring GEA and the source electrode SE.

Openings GO and SO are formed in the protective insulating film. The gate wiring GEA is exposed from the opening GO, while the source electrode SE is exposed from the opening SO. Each of the exposed gate wiring GEA and source electrode SE is used for electric connection with an external element.

A drain electrode (not shown) is formed at a backside of the semiconductor device CP to cover the semiconductor substrate SUB.

Next, the structure of a unit cell in the power MOSFET shown in FIG. 1 will be described below with reference to FIGS. 2 and 3.

Figure 2:
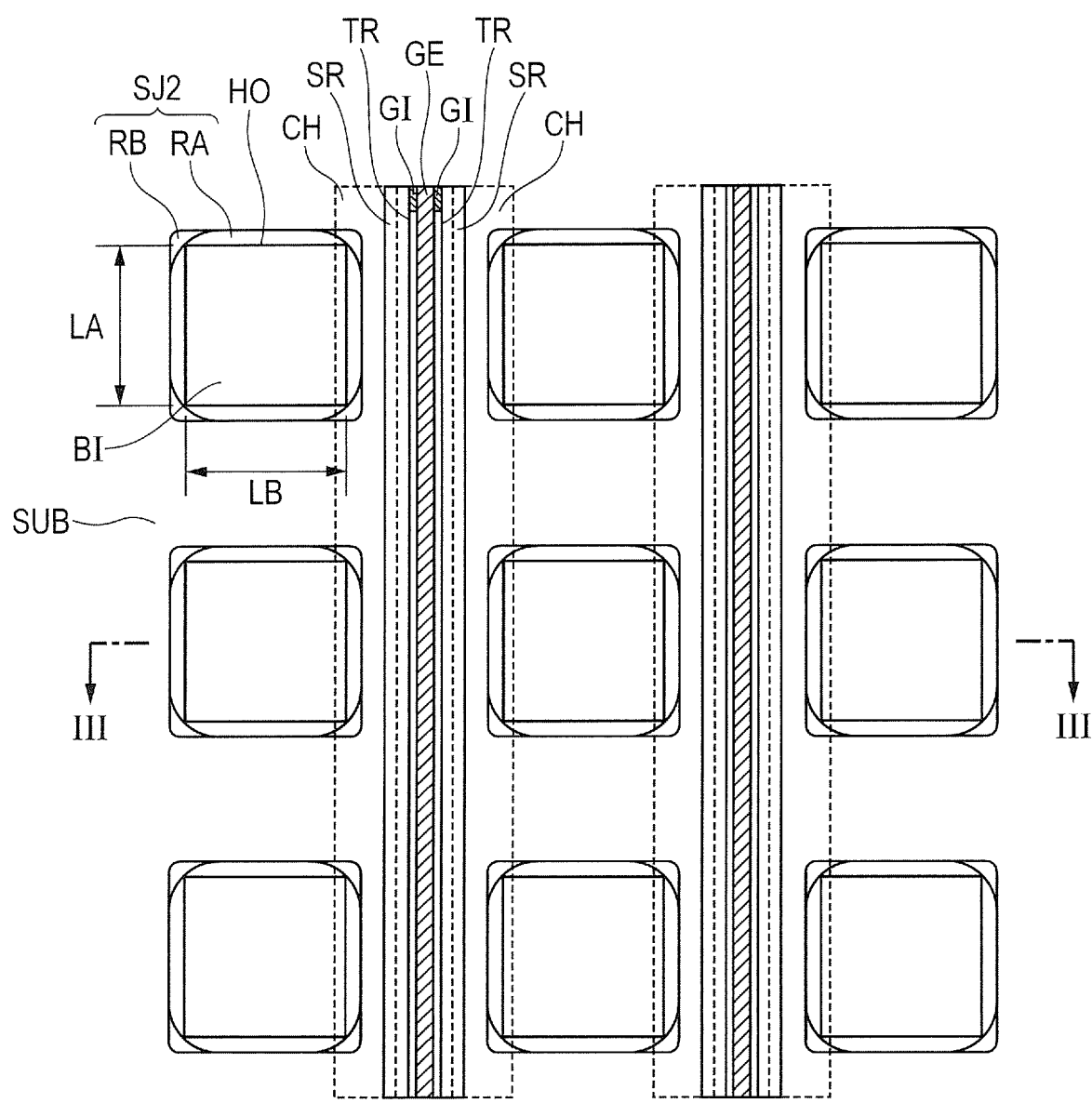
FIG. 2 is an enlarged plan view of a region R shown in FIG. 1, showing a cell layout of the power MOSFET.

As shown in FIG. 2, in the planar view, a plurality of gate electrodes GE respectively extends in a predetermined direction (or the up-down direction as shown in the figure). The gate electrodes GE are disposed in parallel with a spacing therebetween. Each of the gate electrodes GE is electrically coupled to the gate wiring GEA (see FIG. 1) at an outer edge of the chip in the up-down direction shown in the figure.

The term "planar view" as used herein means the point of view from a direction perpendicular to a front surface S1 of the semiconductor substrate SUB.

In the planar view, a plurality of hole portions HO is arranged in a region sandwiched between the adjacent gate electrodes GE. Each of the hole portions HO extends from the front surface into the inside of the semiconductor substrate SUB.

The respective hole portions HO are arranged along the direction in which the gate electrode GE extends in the region sandwiched by the gate electrodes GE. The hole portions HO are positioned at a predetermined intervals and at intersection points of a lattice.

Each of the hole portions HO has, for example, a square shape in the planar view. Thus, in the planar view, dimensions LA and LB of four sides of the hole portion HO are equal to each other, and four angles of the hole portion HO are all equal. The planar shape of each of the hole portions HO is not limited to a square shape and may be a polygonal shape.

Figure 3:
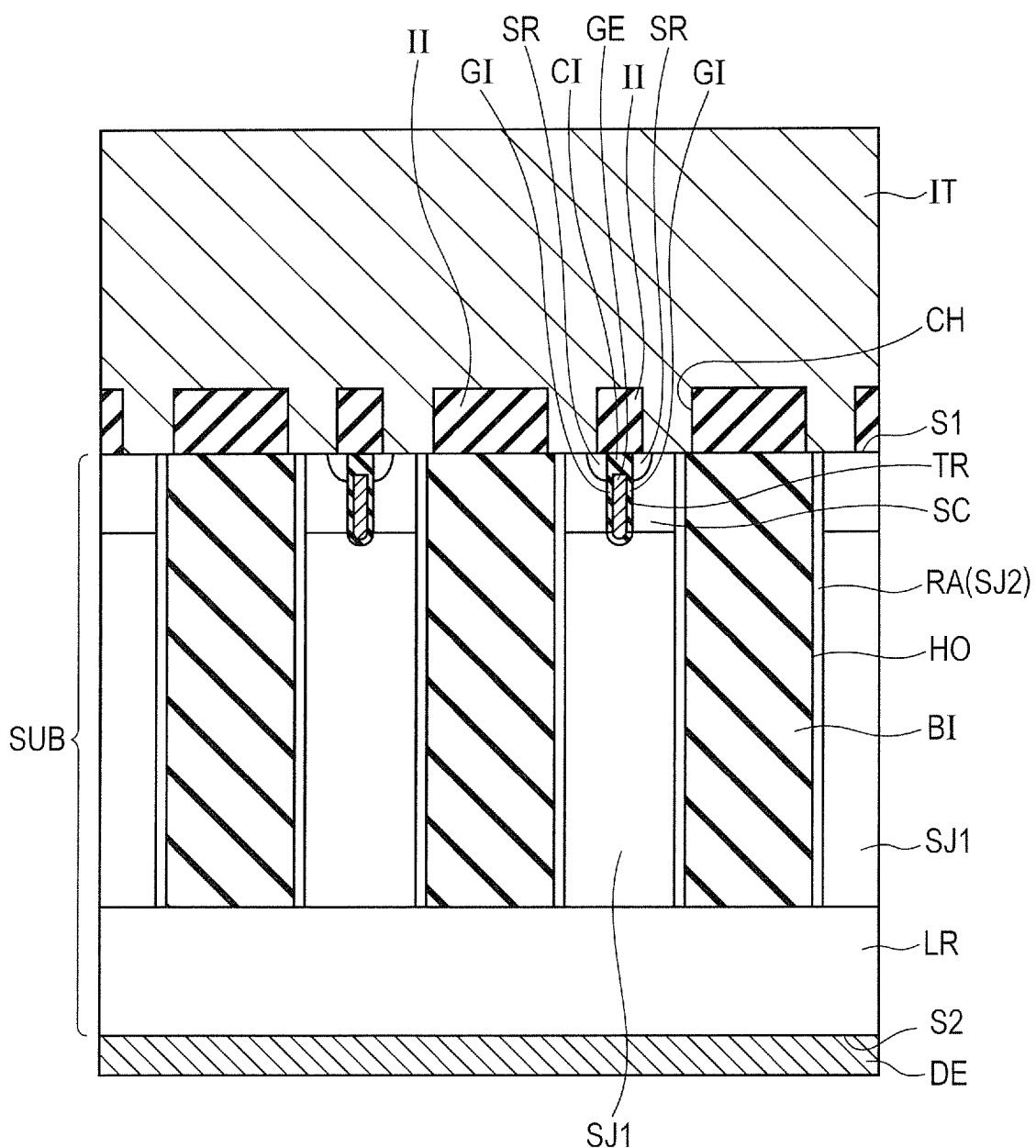
FIG. 3 is a schematic cross-sectional view of the power MOSFET taken along the line III-III in FIG. 2.

As shown in FIG. 3, the semiconductor substrate SUB is formed of, for example, monocrystalline silicon, and has the front surface S1 and a back surface S2. In the semiconductor substrate SUB, the power MOSFET is formed. The power MOSFET includes an n⁻region LR, n-type regions (first impurity regions) SJ1, p-type channel formation regions SC, n-type source regions SR, gate insulating films GI, and the gate electrodes GE.

The n⁻region LR is a region with a low resistance and formed at the back surface S2 of the semiconductor substrate SUB. The n-type regions SJ1 are positioned on a side of the front surface S1 of the n⁻region LR and coupled with the n⁻region LR. Each of the p-type channel formation regions SC is positioned on the side of the front surface S1 of the corresponding n-type region SJ1 and forms p-n junction with the n-type region SJ1. The channel formation regions SC are positioned at the front surface S1 of the semiconductor substrate SUB.

Each of the n-type source regions SR is positioned on the side of the front surface S1 of the semiconductor substrate SUB and forms p-n junction with the corresponding channel formation region SC. Trenches TR are formed at the front surface S1 of the semiconductor substrate SUB. Each trench TR passes through the n-type source regions SR and the channel formation regions SC from the front surface S1 of the semiconductor substrate SUB to reach the corresponding n-type region SJ1.

The gate insulating films GI are formed along the wall surfaces of each trench TR. Each of gate insulating films GI is formed of, for example, a silicon oxide film. The gate electrode GE is embedded in each trench TR. In this way, the gate electrode GE is opposed, via the gate insulating films GI, to the channel formation regions SC, each being sandwiched between the n-type source region SR and the n-type region SJ1.

The gate electrode GE is formed of, for example, polycrystalline silicon (doped polysilicon) with impurities introduced thereinto. A region in the trench TR located above the gate electrode GE is filled with an insulating film CI. The insulating film CI is formed of, for example, silicon oxide ($SiO_2$).

The above-mentioned power MOSFET has a superjunction structure. The superjunction structure includes the above-mentioned n-type regions SJ1 and p-type regions (second impurity regions) SJ2.

Specifically, the hole portion HO is formed between the adjacent gate electrodes GE at the front surface S1 of the semiconductor substrate SUB. Each hole portion HO passes through the channel formation regions SC and the n-type region SJ1 from the front surface S1 of the semiconductor substrate SUB to reach the n⁻region LR. An insulating film BI is embedded in each hole portion HO. The insulating film BI is formed of, for example, silicon oxide ($SiO_2$).

The p-type regions SJ2 are formed along the wall surfaces of the respective hole portions HO. Each p-type region SJ2 is continuously formed from the front surface S1 of the semiconductor substrate SUB to reach the n⁻region LR. The p-type region SJ2 forms the p-n junction with the n-type region SJ1. The p-n junction formed between the p-type region SJ2 and the n-type region SJ1 extends along the depth direction of the semiconductor substrate SUB (in the direction from the front surface S1 to the back surface S2). In this way, the p-type regions SJ2 and the n-type regions SJ1 form the p-n junction extending in the depth direction to form the superjunction structure.

In the superjunction structure, a depletion layer is expanded in the lateral direction from the p-n junction formed by the p-type regions SJ2 and the n-type regions SJ1, whereby the p-type regions SJ2 and the n-type regions SJ1 are completely depleted, thereby insulating a region between the source and the drain.

For this reason, the n-type impurity concentration in the n-type region SJ1 needs to be not more than a concentration that completely depletes a region with the widest distance between the p-n junctions (substantially, the distance between the hole portions HO). Conversely, as the distance between the hole portions HO is decreased, the width of the n-type region SJ1 serving as a current route when energized becomes narrower, resulting in a high conduction resistance. Therefore, the distance between the hole portions HO is preferably set equally as much as possible in any direction.

An interlayer insulating film II is formed over the front surface S1 of the semiconductor substrate SUB. The interlayer insulating film II is formed of, for example, phosphorus silicon glass (PSG). Contact holes CH are formed in the interlayer insulating film II.

The contact holes CH are formed to extend from the upper surface of the interlayer insulating film II to reach the front surface S1 of the semiconductor substrate SUB. The n-type source regions SR, the p-type channel formation regions SC, and the p-type regions SJ2 are exposed from the contact holes CH.

A wiring layer IT is formed over an upper surface of the interlayer insulating film II. The wiring layer IT is formed of metal, for example, aluminum (Al). The wiring layer IT is electrically coupled to the respective n-type source regions SR, p-type channel formation regions SC, and p-type regions SJ2 through the contact holes CH.

A drain electrode DE is formed over the back surface S2 of the semiconductor substrate SUB. The drain electrode DE is formed of, for example, metal. The drain electrode DE is electrically coupled to an n⁻region LR.

Figure 4:
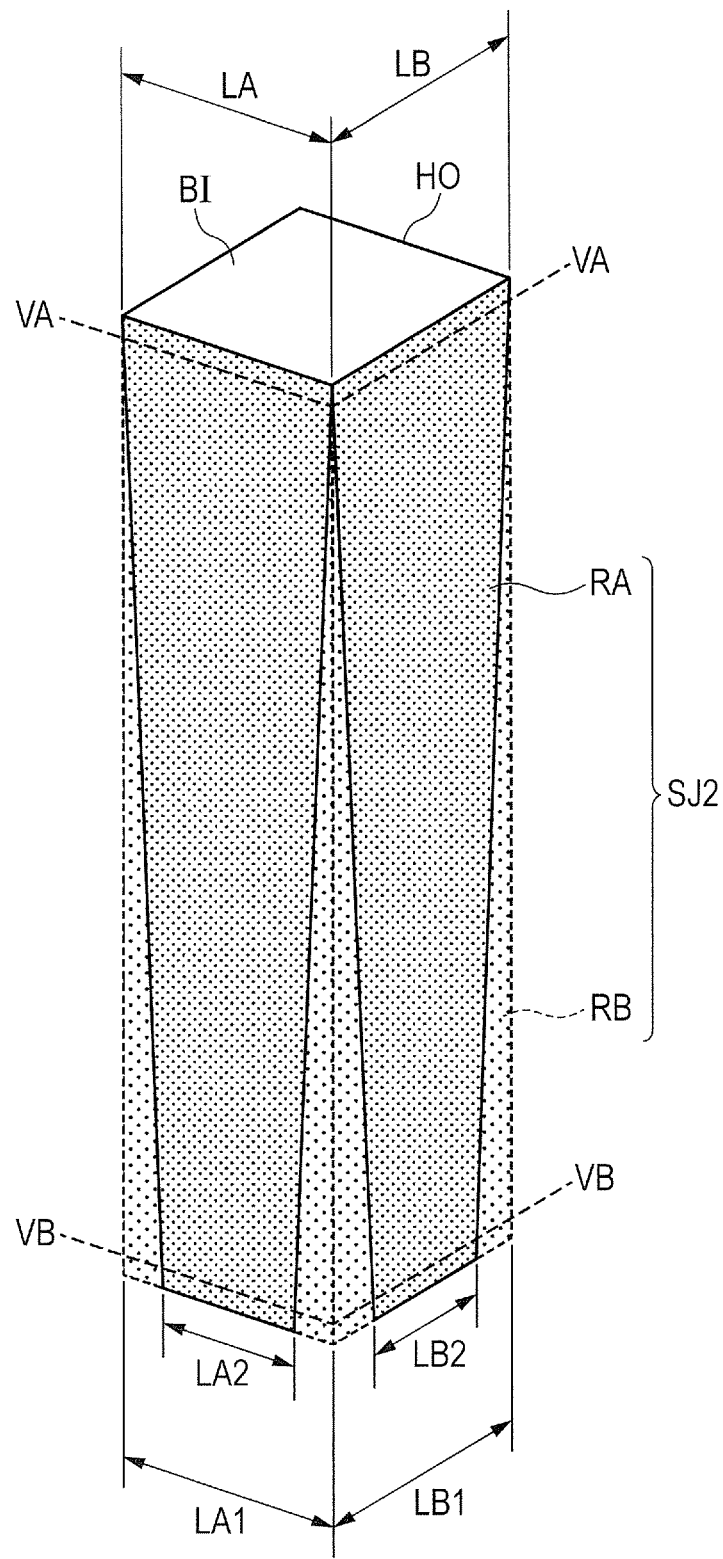
FIG. 4 is a perspective view showing the distribution of high-concentration regions along wall surfaces of a hole portion shown in FIG. 3.
Figure 5A:
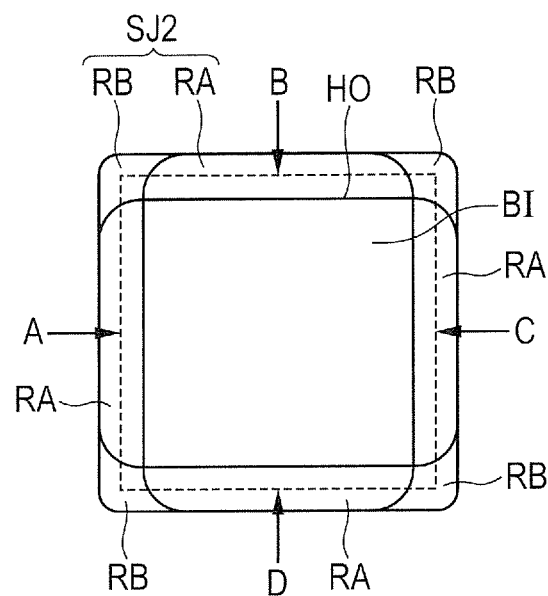
FIG. 5A shows the hole portion and a p-type region taken along the line VA-VA of FIG. 4.
Figure 5B:
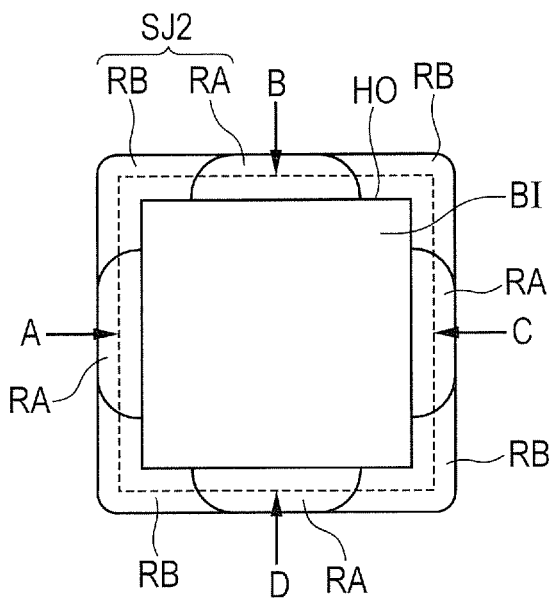
FIG. 5B shows the hole portion and a p-type region taken along the line VB-VB of FIG. 4.

Next, the p-type region SJ2 will be described below using FIGS. 4 to 7. As shown in FIGS. 4, 5A, and 5B, each p-type region SJ2 has a high-concentration region RA and a low-concentration region RB. A width of the high-concentration region RA along the wall surface of the hole portion HO becomes smaller from the front surface S1 of the semiconductor substrate SUB toward a deeper position. Thus, the width LA2 (or LB2) of the high-concentration region RA at the bottom surface of the hole portion HO is smaller than the width LA (or LB) of the high-concentration region RA at the front surface S1 of the semiconductor substrate SUB.

The high-concentration region RA at the wall surface of the hole portion HO has a trapezoidal shape. In the trapezoidal shape, one of its parallel opposed sides (side at the front surface S1) is longer, while the other (side at the bottom surface of the hole portion HO) is shorter.

A width of the low-concentration region RB along the wall surface of the hole portion HO increases from the front surface S1 of the semiconductor substrate SUB toward a deeper position. Thus, the width of the low-concentration region RB at the bottom surface of the hole portion HO is larger than the width (for example, 0 (zero)) of the low-concentration region RB at the front surface S1 of the semiconductor substrate SUB.

The depth of each of the high-concentration region RA and the low-concentration region RB from the front surface S1 is equal to or deeper than the depth from the front surface S1 of the hole portion HO.

As shown in FIGS. 4 and 5A, the width LA (or LB) of the high-concentration region RA at the front surface S1 of the semiconductor substrate SUB is equal to the length LA (or LB) of one side of the hole portion HO at the front surface S1 of the semiconductor substrate SUB. That is, the high-concentration region RA is disposed along the entire length of one side of the hole portion HO at the front surface S1 of the semiconductor substrate SUB.

The low-concentration region RB is disposed only at the corner of the hole portion HO at the front surface S1 of the semiconductor substrate SUB.

As shown in FIGS. 4 and 5B, the width LA2 (or LB2) of the high-concentration region RA at the bottom surface of the hole portion HO is smaller than the length LA1 (or LB1) of one side of the hole portion HO at the bottom surface of the hole portion HO. That is, at the bottom surface of the hole portion HO, the high-concentration region RA is disposed only at a part of one side (only the center part of one side) of the hole portion HO.

At the bottom surface of the hole portion HO, the low-concentration regions RB are disposed at the corners and both ends of one side of the hole portion HO.

Figure 6:
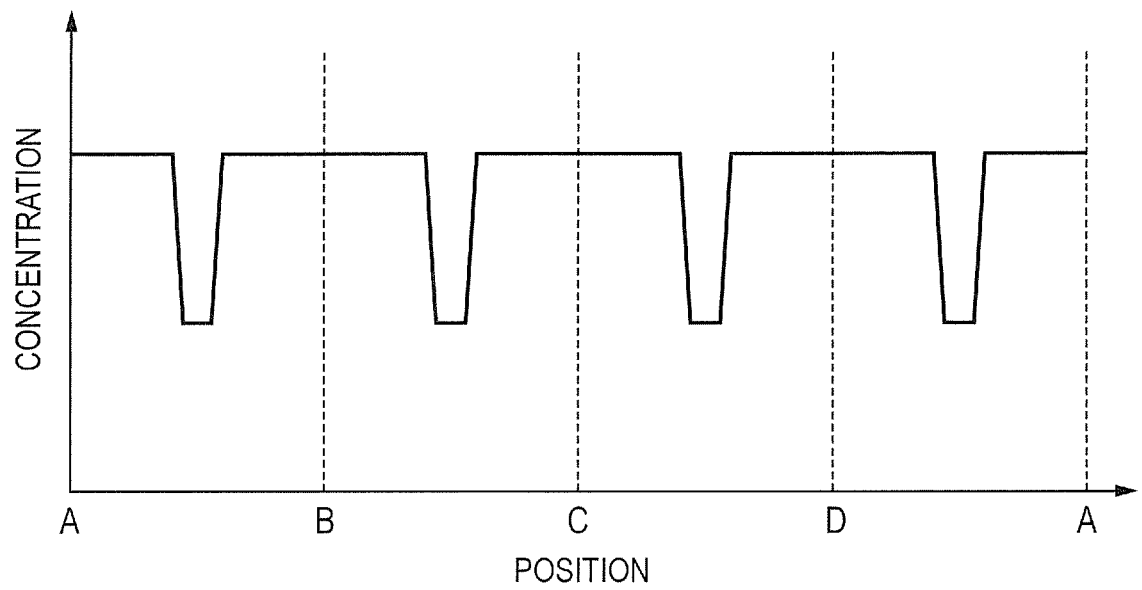
FIG. 6 shows an impurity concentration distribution along the dashed line in FIG. 5A.
Figure 7:
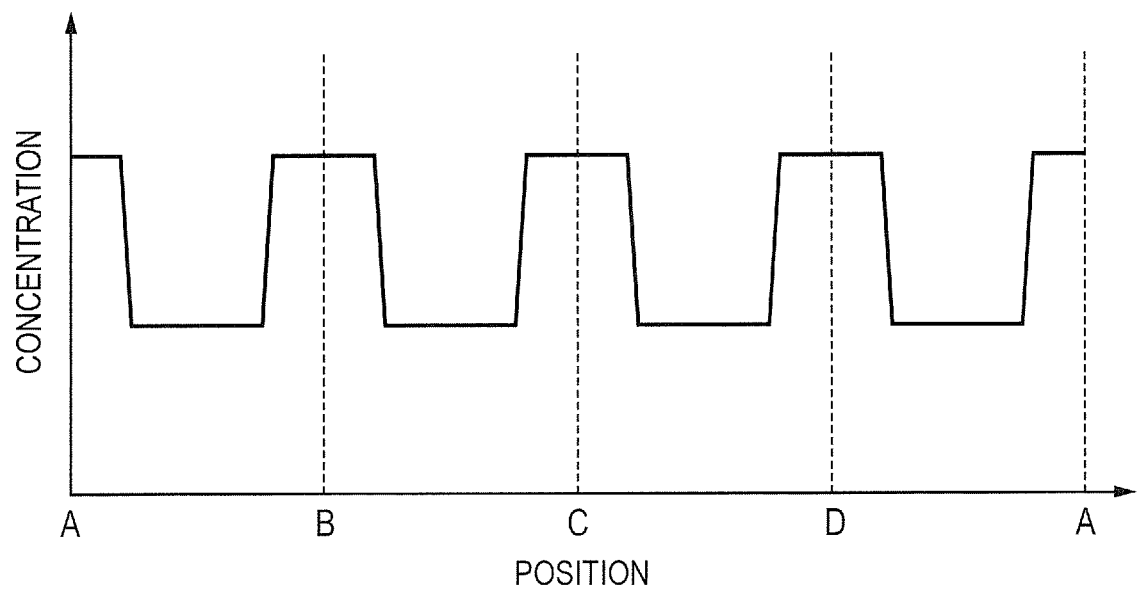
FIG. 7 shows an impurity concentration distribution along the dashed line in FIG. 5B.

As shown in FIG. 6, at the front surface S1 of the semiconductor substrate SUB, the low-concentration regions RB are positioned only at the corners of the hole portion HO, whereby only the p-type impurity concentration located at those parts is lower than that in other parts. As shown in FIG. 7, at the bottom part of the hole portion HO, the low-concentration regions RB are positioned only at the corners of the hole portion HO and both ends of each side of the hole portion HO, whereby only the p-type impurity concentration located at those parts is lower than that in other parts.

As shown in FIGS. 6 and 7, the p-type impurity concentration in the high-concentration region RA is, for example, twice as high as that in the low-concentration region RB. Alternatively, the p-type impurity concentration in the high-concentration region RA may be twice or more times as high as that in the low-concentration region RB.

Now, a method for manufacturing a semiconductor device in this embodiment will be described with reference to FIGS. 3 and 8 to 20.

Figure 8:
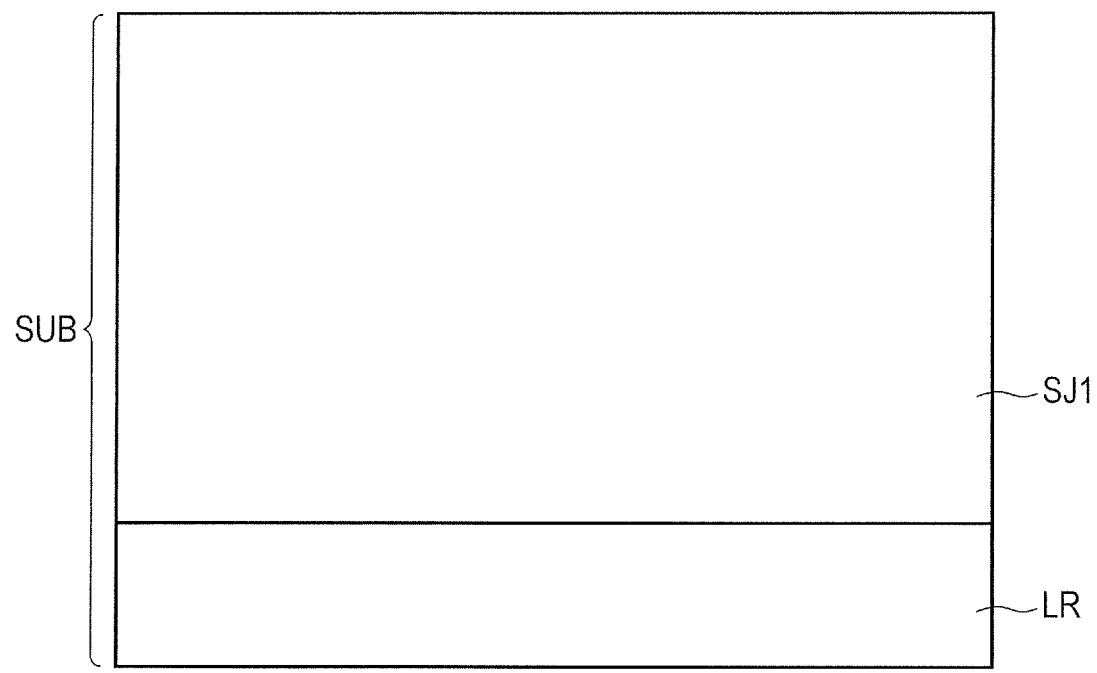
FIG. 8 is a schematic cross-sectional view showing a first step of a manufacturing method for the semiconductor device in the first embodiment.

As shown in FIG. 8, the n-type region SJ1 is formed over the low-resistance n⁻region LR, for example, by epitaxial growth.

Figure 9:
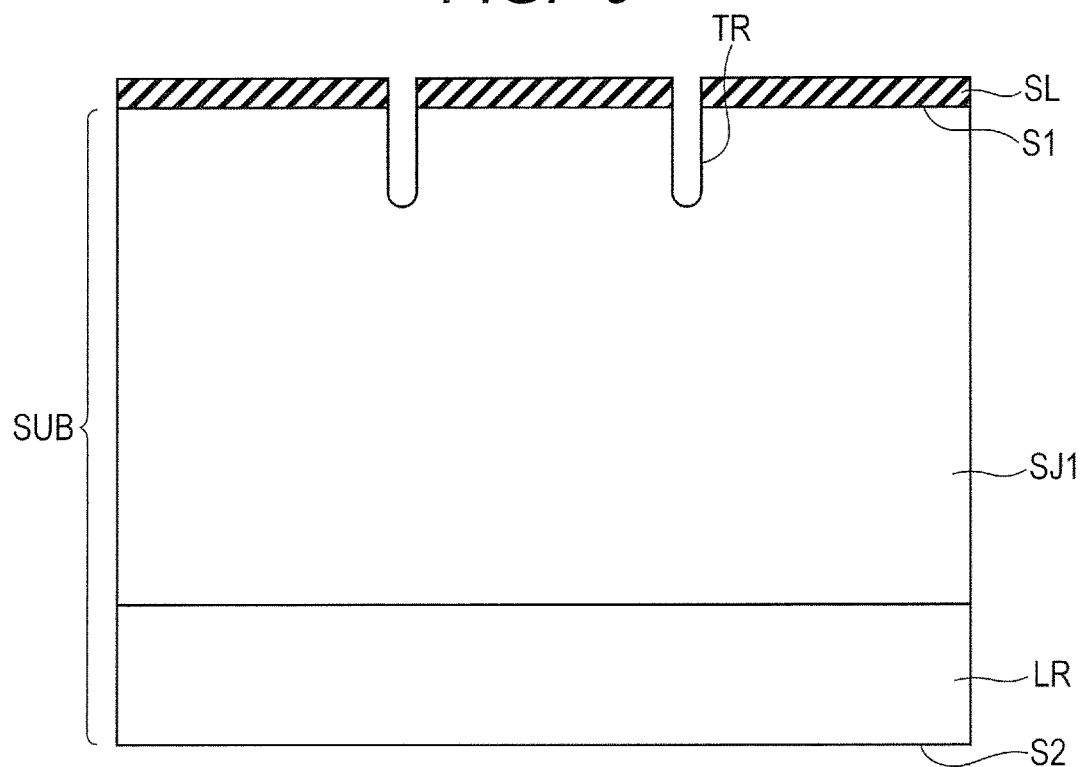
FIG. 9 is a schematic cross-sectional view showing a second step of the manufacturing method for the semiconductor device in the first embodiment.

As shown in FIG. 9, an insulating film SL is formed over the front surface S1 of the n-type region SJ1. The insulating film SL is patterned by normal photolithography technology and dry etching. The front surface S1 of the n-type region SJ1 is further subjected to dry etching using the patterned insulating film SL as a mask. Thus, the trenches TR for gates are formed in the front surface S1 of the n-type region SJ1.

Figure 10:
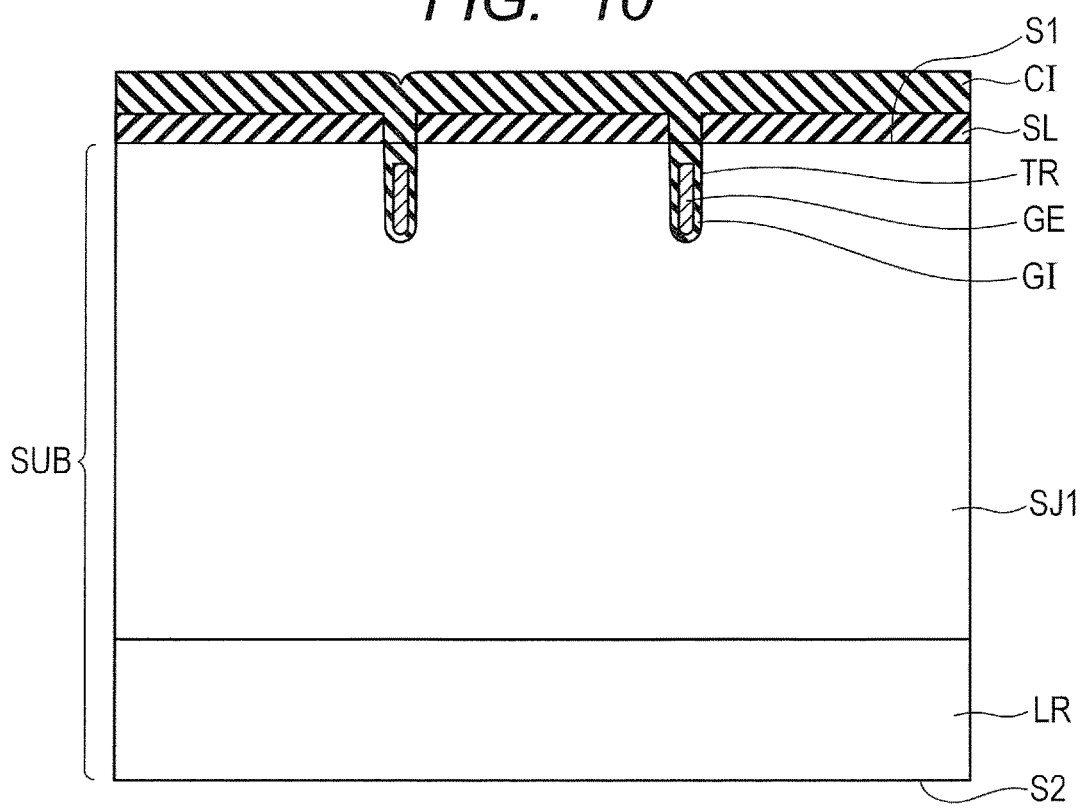
FIG. 10 is a schematic cross-sectional view showing a third step of the manufacturing method for the semiconductor device in the first embodiment.

As shown in FIG. 10, the gate insulating film GI is formed at the wall surface of each trench TR by thermal oxidation or chemical vapor deposition (CVD). The gate insulating film GI is formed of, for example, a silicon oxide film.

Thereafter, a doped polysilicon film is deposited, for example, by the CVD to fill the trenches TR. Then, the doped polysilicon film is etched to remain in each trench TR. In this way, the gate electrodes GE are formed of the doped polysilicon films that remain in the respective trenches TR. Furthermore, the insulating film CI is formed over the insulating film SL, for example, by the CVD to fill the trenches TR.

Figure 11:
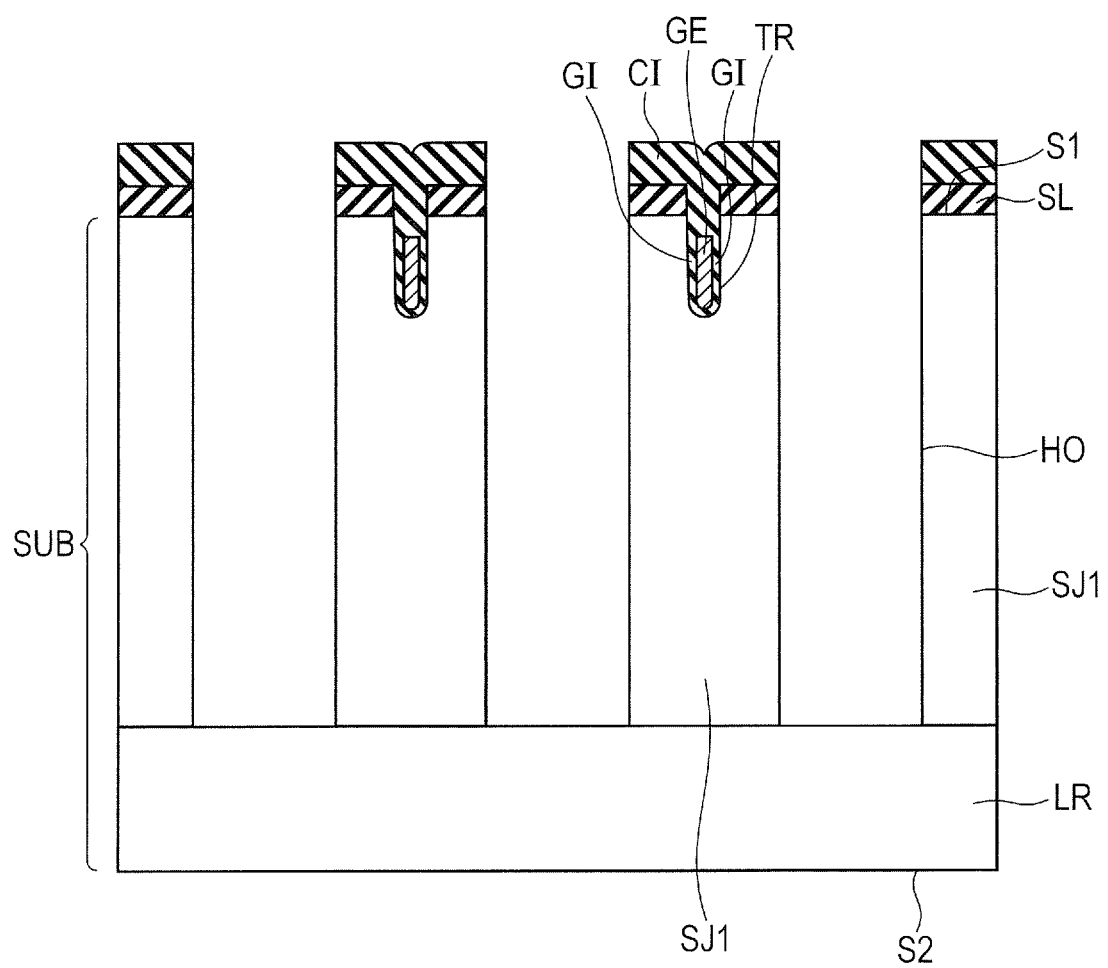
FIG. 11 is a schematic cross-sectional view showing a fourth step of the manufacturing method for the semiconductor device in the first embodiment.

As shown in FIG. 11, the insulating films CI and SL are patterned by normal photolithography technology and dry etching to produce patterns for the hole portions. The front surface S1 of the n-type region SJ1 is subjected to dry etching using the patterned insulating films CI and SL as a mask. Thus, the hole portions HO are formed. Each hole portion HO is formed, for example, to pass through the n-type region SJ1 to reach the n⁻region LR.

Figure 12:
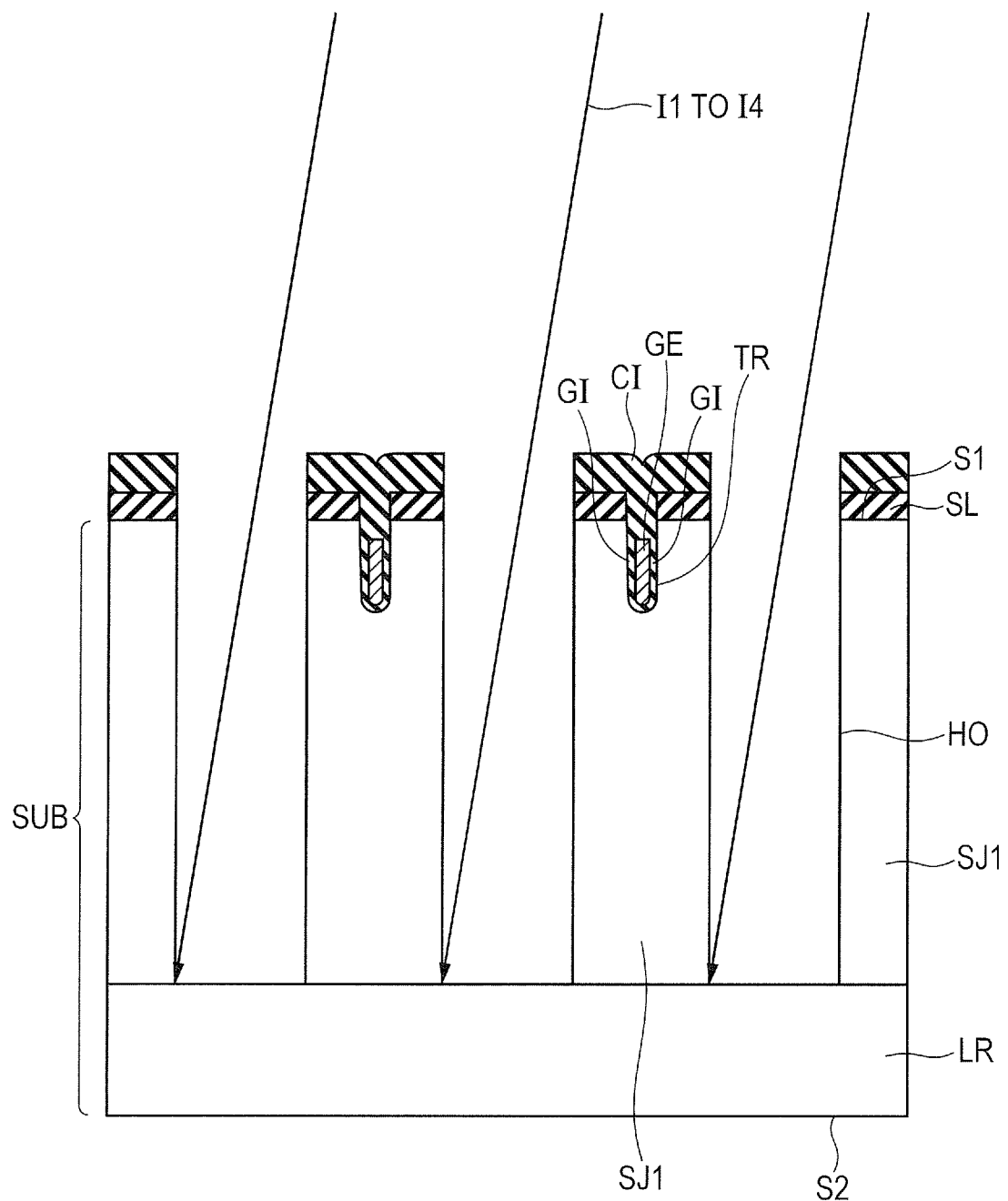
FIG. 12 is a schematic cross-sectional view showing a fifth step of the manufacturing method for the semiconductor device in the first embodiment.

As shown in FIG. 12, the wall surfaces of the hole portions HO are oxidized thinly. Thereafter, ion implantation is performed in the direction that is inclined relative to the front surface S1 of the semiconductor substrate SUB. The ion implantation is performed a plurality of times (for example, four times), for example, as shown in FIGS. 17 to 20. In the following, the ion implantation will be described with reference to FIGS. 17 to 21.

Figure 17A:
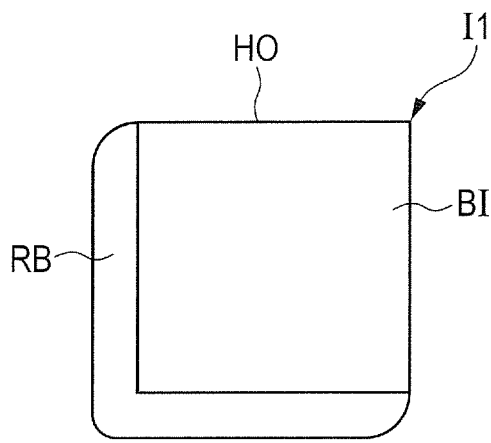
FIGS. 17A and 17B show a first substep in an ion implantation step shown in FIG. 12, in which FIG. 17A corresponds to FIG. 5A, and FIG. 17B corresponds to FIG. 5B.
Figure 17B:
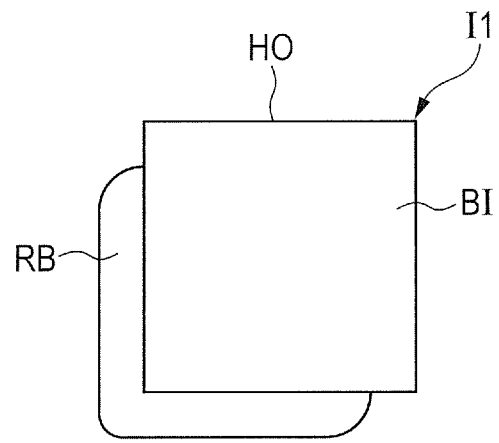

As shown in FIGS. 17A and 17B, p-type impurity ions are implanted along a direction I1 oriented from one of four corners of the hole portion HO toward the diagonal line in the planar view. By the first ion implantation, as illustrated in FIG. 17A, the p-type low-concentration region RB is formed over the entire two sides of four sides of the hole portion HO at the front surface S1 of the semiconductor substrate SUB. As illustrated in FIG. 17B, the p-type low-concentration region RB is formed over parts of two sides of the four sides of the hole portion HO at the bottom surface of the hole portion HO.

Figure 21:
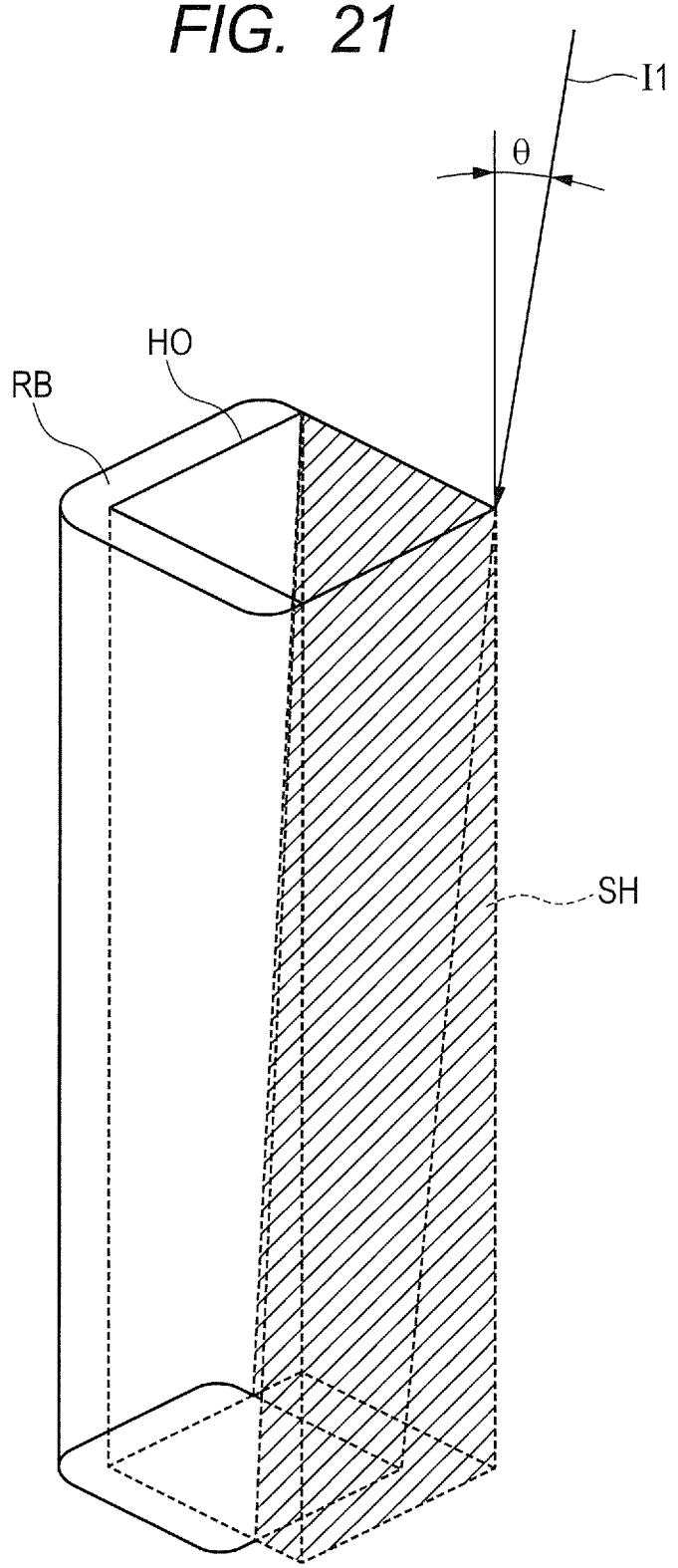
FIG. 21 is a schematic perspective view showing the state of formation of a low-concentration region when performing oblique ion implantation into the hole portion.

As shown in FIG. 21, when implanting ions obliquely relative to the hole portion HO, a region SH (hatched region) where no ion is implanted expands at a deeper position of the hole portion HO. Because of this, as illustrated in FIGS. 17A and 17B, the low-concentration region RB formed at the bottom surface of the hole portion HO is narrower than the low-concentration region RB formed at the front surface S1 of the semiconductor substrate SUB.

Figure 18A:
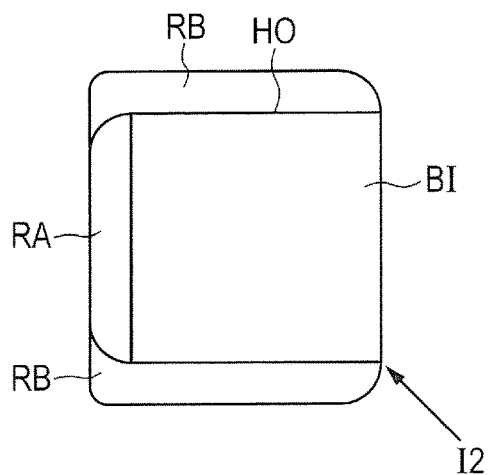
FIGS. 18A and 18B show a second substep in the ion implantation step shown in FIG. 12, in which FIG. 18A corresponds to FIG. 5A, and FIG. 18B corresponds to FIG. 5B.
Figure 18B:
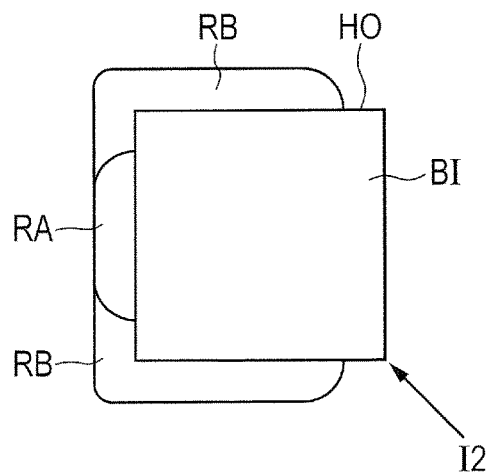

As shown in FIGS. 18A and 18B, p-type impurity ions are implanted into the hole portion HO at a different angle, for example, at 45° relative to the first ion implantation in the planar view. Specifically, the p-type impurity ions are implanted along a direction I2 toward the diagonal line from a different corner (corner adjacent to the first corner) in the planar view among the four corners of the hole portion HO other than the corner where the first ion implantation is applied.

By the second ion implantation described above, as illustrated in FIG. 18A, the p-type low-concentration region RB is formed over the entire two sides of the four sides of the hole portion HO at the front surface S1 of the semiconductor substrate SUB. A region where the low-concentration region RB formed by the first ion implantation and the low-concentration region RB formed by the second ion implantation overlap each other becomes the high-concentration region RA. Thus, the high-concentration region RA has the p-type impurity concentration that is twice as high as that in the low-concentration region RB.

As illustrated in FIG. 18B, the above-mentioned second ion implantation also forms the p-type low-concentration region RB over parts of two sides of the four sides of the hole portion HO at the bottom surface of the hole portion HO. A region where the low-concentration region RB formed by the first ion implantation and the low-concentration region RB formed by the second ion implantation overlap each other becomes the high-concentration region RA. Thus, also at the bottom surface of the hole portion HO, the high-concentration region RA has the p-type impurity concentration that is twice as high as that in the low-concentration region RB.

Figure 19A:
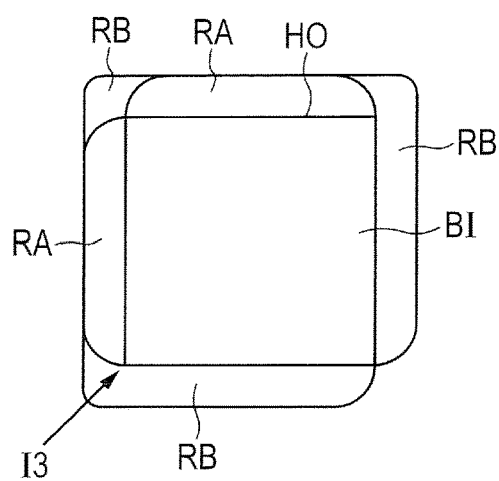
FIGS. 19A and 19B show a third substep in the ion implantation step shown in FIG. 12, in which FIG. 19A corresponds to FIG. 5A, and FIG. 19B corresponds to FIG. 5B.
Figure 19B:
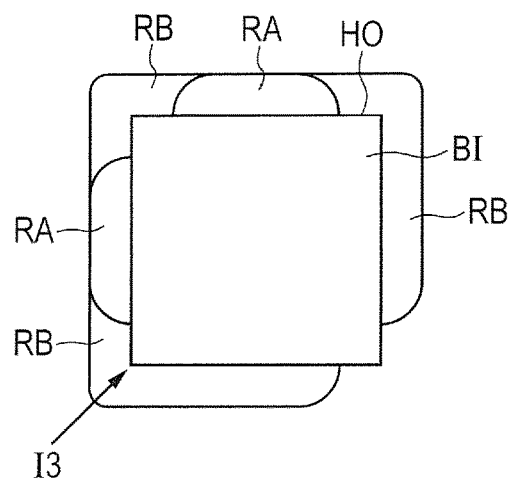

As shown in FIGS. 19A and 19B, p-type impurity ions are implanted into the hole portion HO at a different angle, for example, at 45° relative to the second ion implantation in the planar view. Specifically, the p-type impurity ions are implanted along a direction I3 toward the diagonal line from a different corner (corner adjacent to the second corner) in the planar view among the four corners of the hole portion HO other than the corners where the first and second ion implantations are applied.

By the third ion implantation, as illustrated in FIG. 19A, the p-type low-concentration region RB is formed over the entire two sides of four sides of the hole portion HO at the front surface S1 of the semiconductor substrate SUB. A region where the low-concentration region RB formed by the second ion implantation and the low-concentration region RB formed by the third ion implantation overlap each other becomes the high-concentration region RA. Thus, the high-concentration region RA has the p-type impurity concentration that is twice as high as that in the low-concentration region RB.

As illustrated in FIG. 19B, the above-mentioned third ion implantation also forms the p-type low-concentration region RB over parts of two sides of the four sides of the hole portion HO at the bottom surface of the hole portion HO. A region where the low-concentration region RB formed by the second ion implantation and the low-concentration region RB formed by the third ion implantation overlap each other becomes the high-concentration region RA. Thus, also at the bottom surface of the hole portion HO, the high-concentration region RA has the p-type impurity concentration that is twice as high as that in the low-concentration region RB.

Figure 20A:
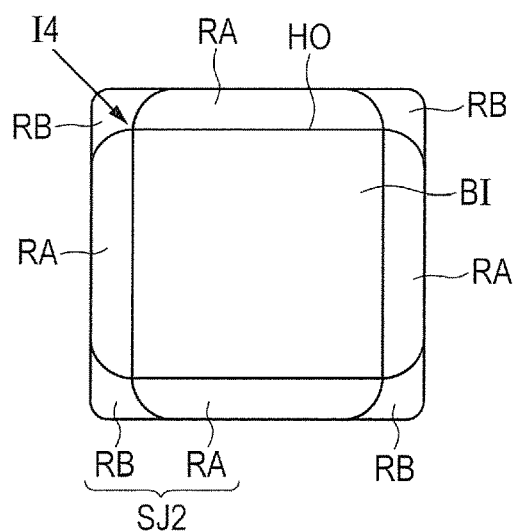
FIGS. 20A and 20B show a fourth substep in the ion implantation step shown in FIG. 12, in which FIG. 20A corresponds to FIG. 5A, and FIG. 20B corresponds to FIG. 5B.
Figure 20B:
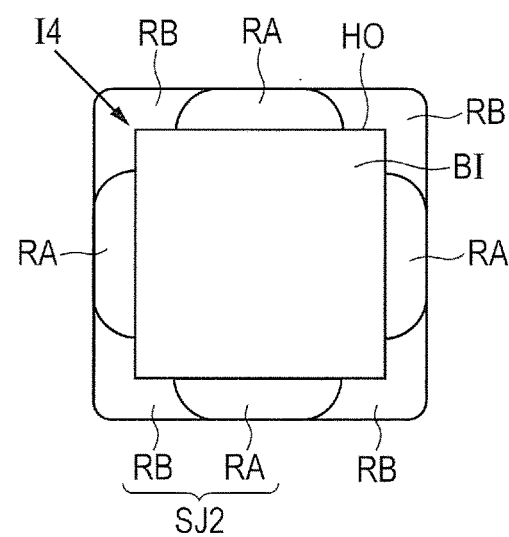

As shown in FIGS. 20A and 20B, p-type impurity ions are implanted into the hole portion HO at a different angle, for example, at 45° relative to the third ion implantation in the planar view. Specifically, the p-type impurity ions are implanted along a direction I4 toward the diagonal line from a different corner (corner between the first and third corners) in the planar view among the four corners of the hole portion HO other than the corners where the first to third ion implantations are applied.

By the fourth ion implantation, as illustrated in FIG. 20A, the p-type low-concentration region RB is formed over the entire two sides of four sides of the hole portion HO at the front surface S1 of the semiconductor substrate SUB. Regions where the low-concentration regions RB formed by the first and third ion implantations and the low-concentration region RB formed by the fourth ion implantation overlap each other become the high-concentration regions RA. Thus, each of the high-concentration regions RA has the p-type impurity concentration that is twice as high as that in the low-concentration region RB.

As illustrated in FIG. 20B, the above-mentioned fourth ion implantation also forms the p-type low-concentration region RB over parts of two sides of the four sides of the hole portion HO at the bottom surface of the hole portion HO. Regions where the low-concentration region RB formed by the first and third ion implantations and the low-concentration region RB formed by the fourth ion implantation overlap each other become the high-concentration regions RA. Thus, also at the bottom surface of the hole portion HO, each of the high-concentration regions RA has the p-type impurity concentration that is twice as high as that in the low-concentration region RB.

Figure 13:
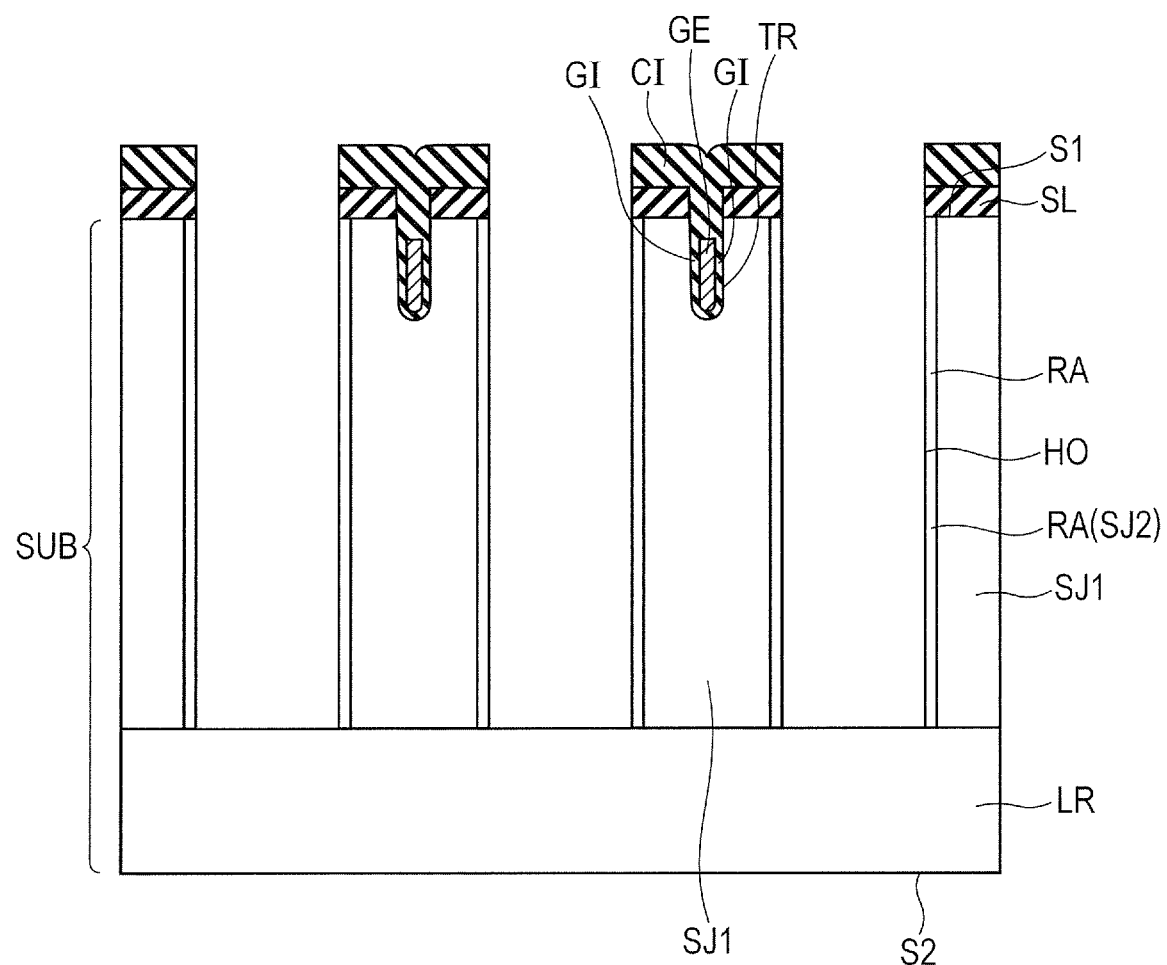
FIG. 13 is a schematic cross-sectional view showing a sixth step of the manufacturing method for the semiconductor device in the first embodiment.

As shown in FIG. 13, after performing the ion implantation a plurality of times (for example, four times) as shown in FIGS. 17 to 20, annealing (heat treatment) is performed to activate the p-type impurities as dopants. Thus, the p-type regions SJ2, each including the high-concentration region RA and the low-concentration region RB, are formed at the wall surfaces of the hole portion HO.

Figure 14:
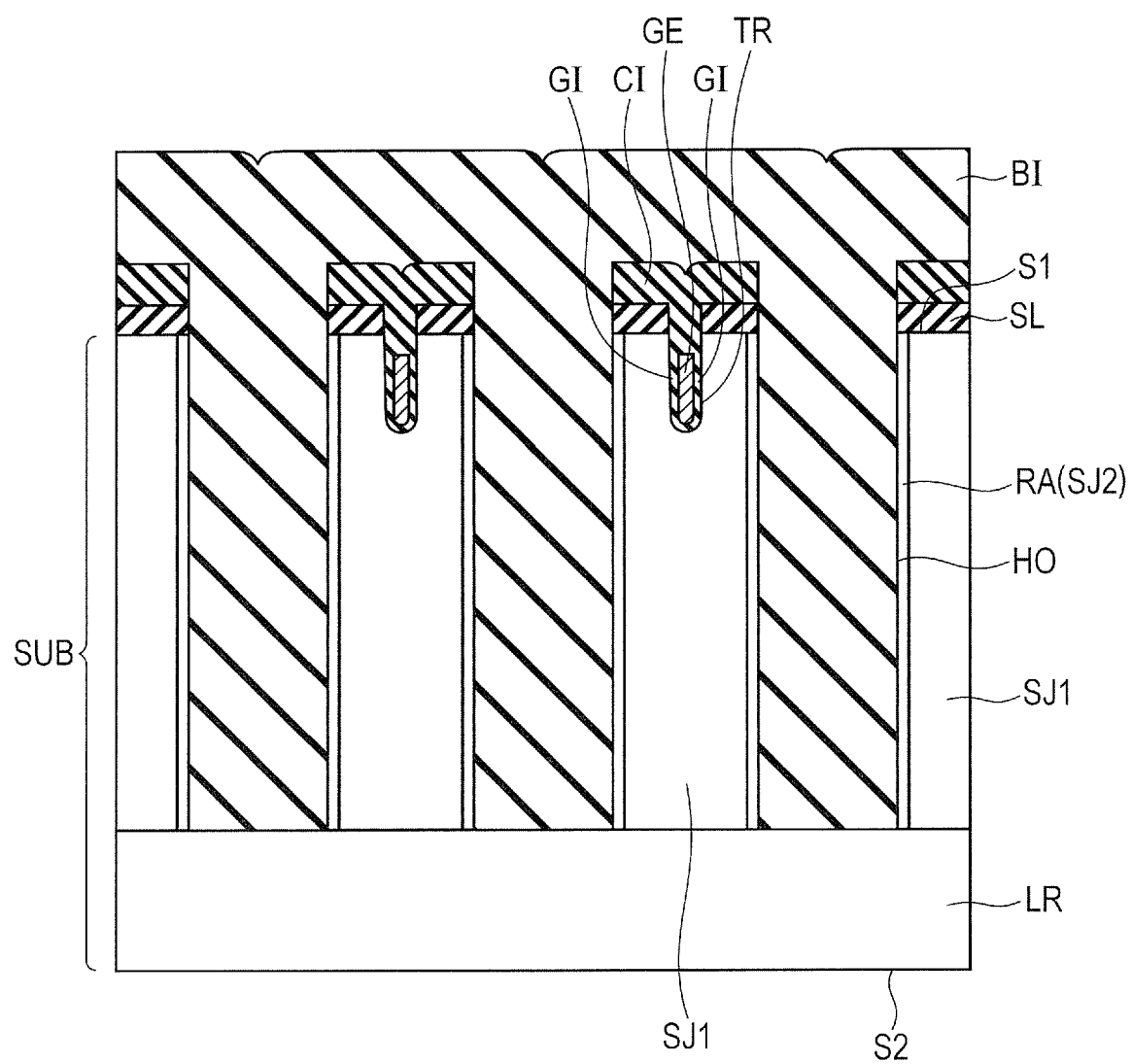
FIG. 14 is a schematic cross-sectional view showing a seventh step of the manufacturing method for the semiconductor device in the first embodiment.

As shown in FIG. 14, the insulating film BI is formed over the insulating film CI, for example, by the CVD to fill the hole portions HO. The CVD for filling the hole portions HO may be performed a plurality of times as needed.

Thereafter, chemical mechanical polishing (CMP) is polished until the front surface S1 of the semiconductor substrate SUB is exposed.

Figure 15:
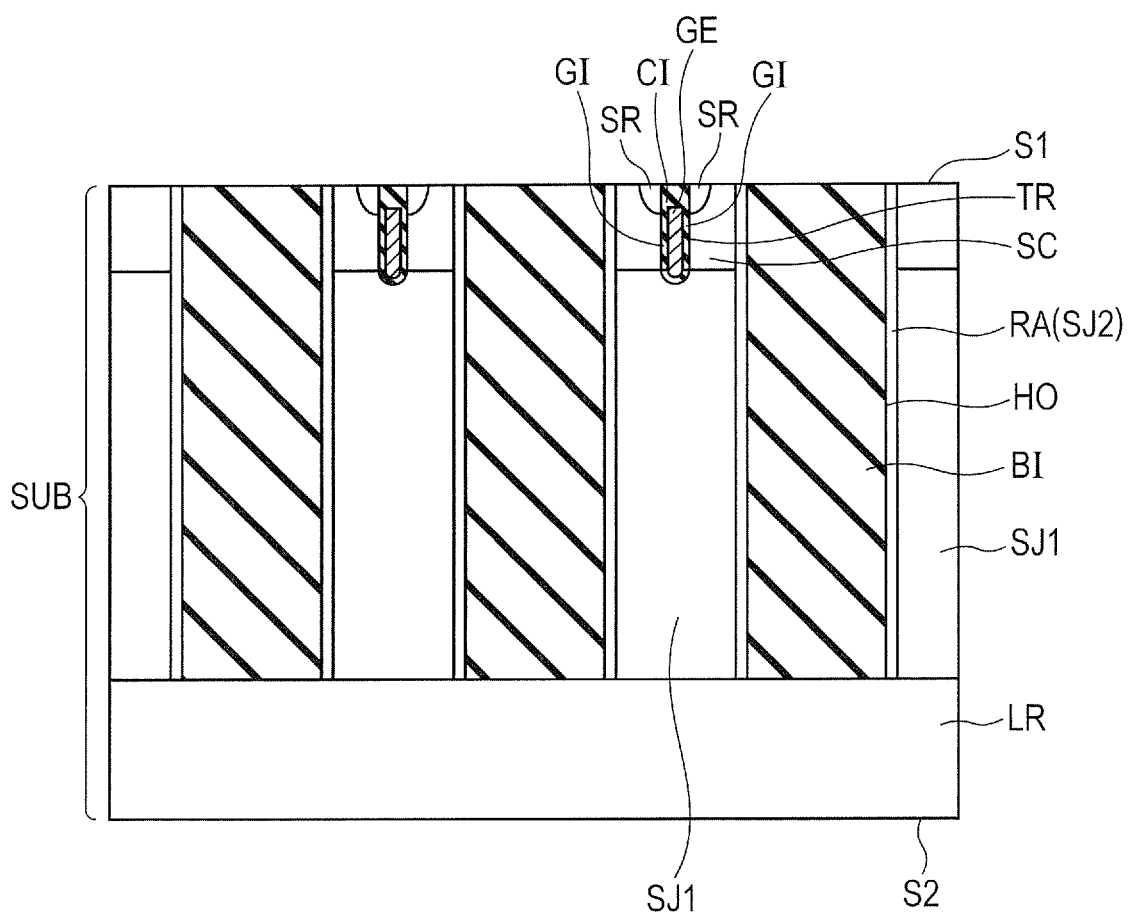
FIG. 15 is a schematic cross-sectional view showing an eighth step of the manufacturing method for the semiconductor device in the first embodiment.

As shown in FIG. 15, the insulating films SL, CI, and BI located above the front surface S1 of the semiconductor substrate SUB are removed therefrom by the above-mentioned CMP. In this way, the insulating film BI remains in each hole portion HO, and the gate insulating films GI, gate electrode GE, and insulating film CI remain within each trench TR.

Thereafter, p-type impurities are implanted into the front surface S1 of the semiconductor substrate SUB, and then annealing is performed for activation. In this way, p-type channel formation regions SC are formed in the front surface S1 of the semiconductor substrate SUB.

Furthermore, n-type impurities are implanted into the front surface S1 of the semiconductor substrate SUB, and then annealing is performed for activation. In this way, n-type source regions SR are formed at side parts of each trench at the front surface S1 of the semiconductor substrate SUB.

Figure 16:
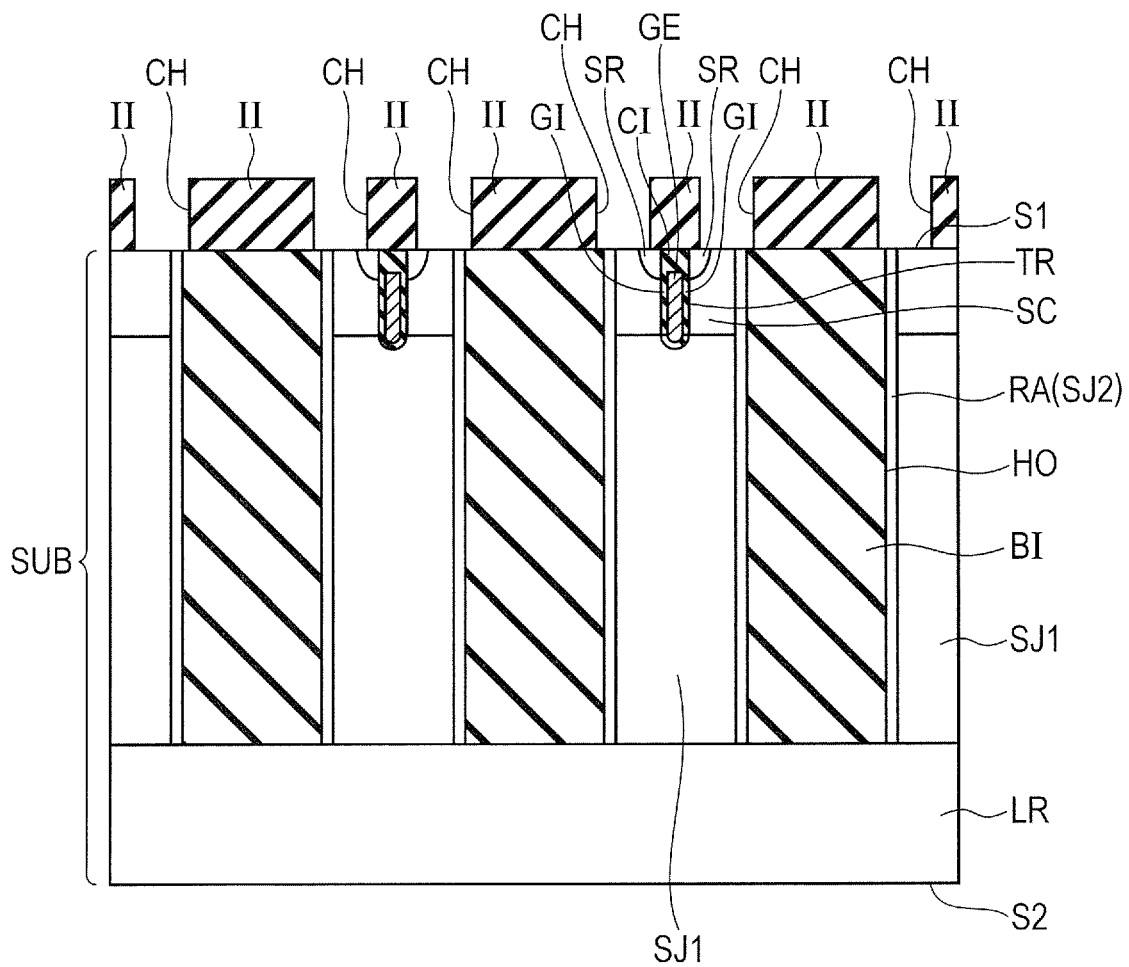
FIG. 16 is a schematic cross-sectional view showing a ninth step of the manufacturing method for the semiconductor device in the first embodiment.

As shown in FIG. 16, the interlayer insulating film II is formed over the front surface S1 of the semiconductor substrate SUB. The interlayer insulating film II is formed of, for example, PSG. Contact holes CH are formed in the interlayer insulating film II by the photolithography technology and dry etching. The contact holes CH are formed to expose the source regions SR, the channel formation regions SC, and the p-type regions SJ2.

As shown in FIG. 3, a barrier metal (not shown) is formed by the CVD. Subsequently, the wiring layer IT is formed by sputtering. The barrier metal and the wiring layer IT are patterned by the photolithography technology and dry etching.

Then, a passivation film (not shown) is formed by coating to cover the wiring layer IT and the like. The passivation film is formed of, for example, polyimide. The openings SO and GO (see FIG. 1) are formed in the passivation film by the photolithography technology and dry etching.

Further, the back surface S2 of the semiconductor substrate SUB is polished. In this way, the semiconductor substrate SUB is formed into a predetermined thickness. Thereafter, the drain electrode DE is formed over the back surface S2 of the semiconductor substrate SUB, for example, by sputtering. Finally, the outer periphery of each chip is cut by dicing, thereby completing a chip CP in the power MOSFET of this embodiment (see FIG. 1).

Next, the functions and effects of this embodiment will be described. To make the MOSFET indestructible during avalanche breakdown, the ratio (p/n ratio) of the p-type impurity concentration in the p-type region SJ2 to the n-type impurity concentration in the n-type region SJ1 needs to deviate from a value that achieves the maximum breakdown voltage when manufacturing. If the impurity amount ratio between the n-type and p-type impurities is set constant in any position in the depth direction of the trench TR, the uniform electric field distribution is obtained in the depth direction of the trench TR as mentioned above. However, in this case, even if there is a slight variation in the p- or n-type impurity concentration, the breakdown voltage is drastically decreased.

In contrast, in this embodiment, as shown in FIGS. 4, 5A, and 5B, a width of the high-concentration region RA along the wall surface of the hole portion HO becomes smaller from the front surface S1 of the semiconductor substrate SUB toward a deeper position. Thus, the p-type impurity concentration is high at the front surface S1 of the semiconductor substrate SUB and becomes lower toward the bottom surface side of the hole portion HO. On the other hand, the n-type regions SJ1 are formed by epitaxial growth and thus have the n-type impurity concentration constant in the depth direction. Thus, the ratio (p/n ratio) of the p-type impurity concentration in the p-type region SJ2 to the n-type impurity concentration in the n-type region SJ1 differs between the front surface S1 side and the back surface S2 side. Specifically, the p/n ratio is high on an anode (source region SR) side and low on a cathode (drain) side. Thus, even when the p/n ratio deviates from the optimal conditions that achieves the highest breakdown voltage, the breakdown voltage is prevented from drastically decreasing, thereby facilitating the manufacture of an element with a desired breakdown voltage.

In this embodiment, the p/n ratio changing in the depth direction is obtained by changing an angle of the ion implantation relative to the hole portion HO in the planar view as shown in FIGS. 17 to 20. This method only needs to change the angle of the ion implantation to obtain the p/n ratio that changes in the depth direction, and thus it is not necessary to precisely control the shapes of the trenches TR, including the width of the opening in the trench TR, and the inclination angle of the side surface of the trench TR. Therefore, the method of this embodiment can achieve the stable device characteristics because it is less susceptible to errors in the manufacture.

Second Embodiment

This embodiment differs from the method in the first embodiment in that the n-type region SJ1 shown in FIG. 8 is set at the n-type (or p-type is possible) where an impurity concentration is low, and that in the ion implantation step shown in FIG. 12, both the n-type impurities and the p-type impurities are ion-implanted.

In this embodiment, in the ion implantation step shown in FIG. 12, first, n-type impurities are ion-implanted. Subsequently, the n-type impurities are diffused into the entire region between the adjacent hole portions HO by thermal diffusion, whereby the n-type region SJ1 has a desired concentration. Then, p-type impurities are ion-implanted, followed by activation annealing, thereby forming the p-type regions SJ2.

Figure 22:
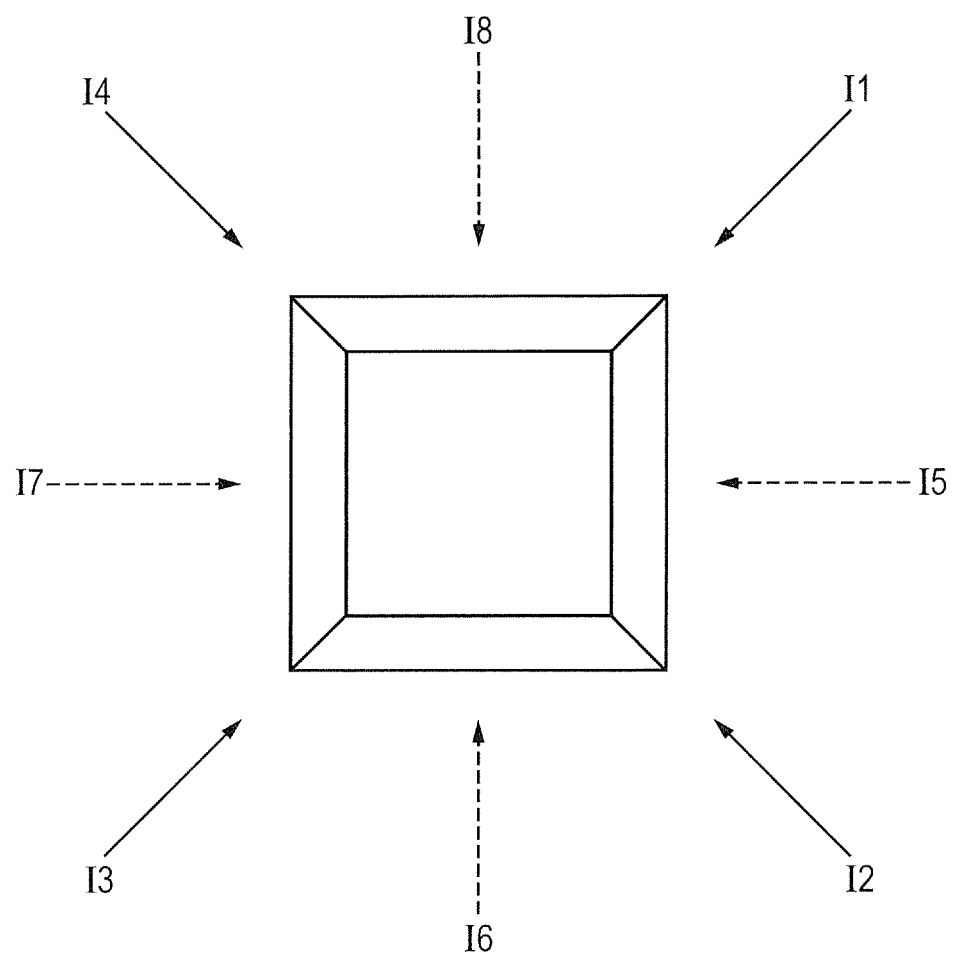
FIG. 22 is a plan view of the surroundings of the hole portion for showing the manufacturing method for the semiconductor device in a second embodiment.

In the implantation of the n-type impurity ions, as shown in FIG. 22, the n-type impurity ions are implanted in directions I5 to I8 perpendicular to the respective side surfaces of each hole portion HO in the planar view. On the other hand, in the implantation of the p-type impurity ions, as shown in FIG. 22, the p-type impurity ions are implanted in directions I1 to I4 that rotate by 45° relative to the implantation directions of the n-type impurity ions in the planar view.

Note that the manufacturing method in this embodiment is substantially the same as the manufacturing method in the first embodiment except for these points, and thus a description thereof will not be repeated below.

The implantation amounts of the n-type impurities ion-implanted into upper and lower parts of the side surfaces of the hole portion HO are substantially at a certain level, while the implantation amounts of the p-type impurities have the gradient distribution shown in FIG. 4. Thus, this embodiment also obtains the same effects as those in the first embodiment.

In the first embodiment, the impurity concentration in the n-type region SJ1 is determined by the epitaxial step, while the impurity concentration in the p-type region SJ2 is determined by the ion implantation step. Because of this, to control the p/n ratio, it is necessary to precisely control such different two types of steps.

In contrast, in this embodiment, both the impurity concentration in the n-type region SJ1 and the impurity concentration in the p-type region SJ2 are controlled by the ion implantation. Because of this, it becomes easy to manage the manufacturing steps.

Third Embodiment

Figure 23:
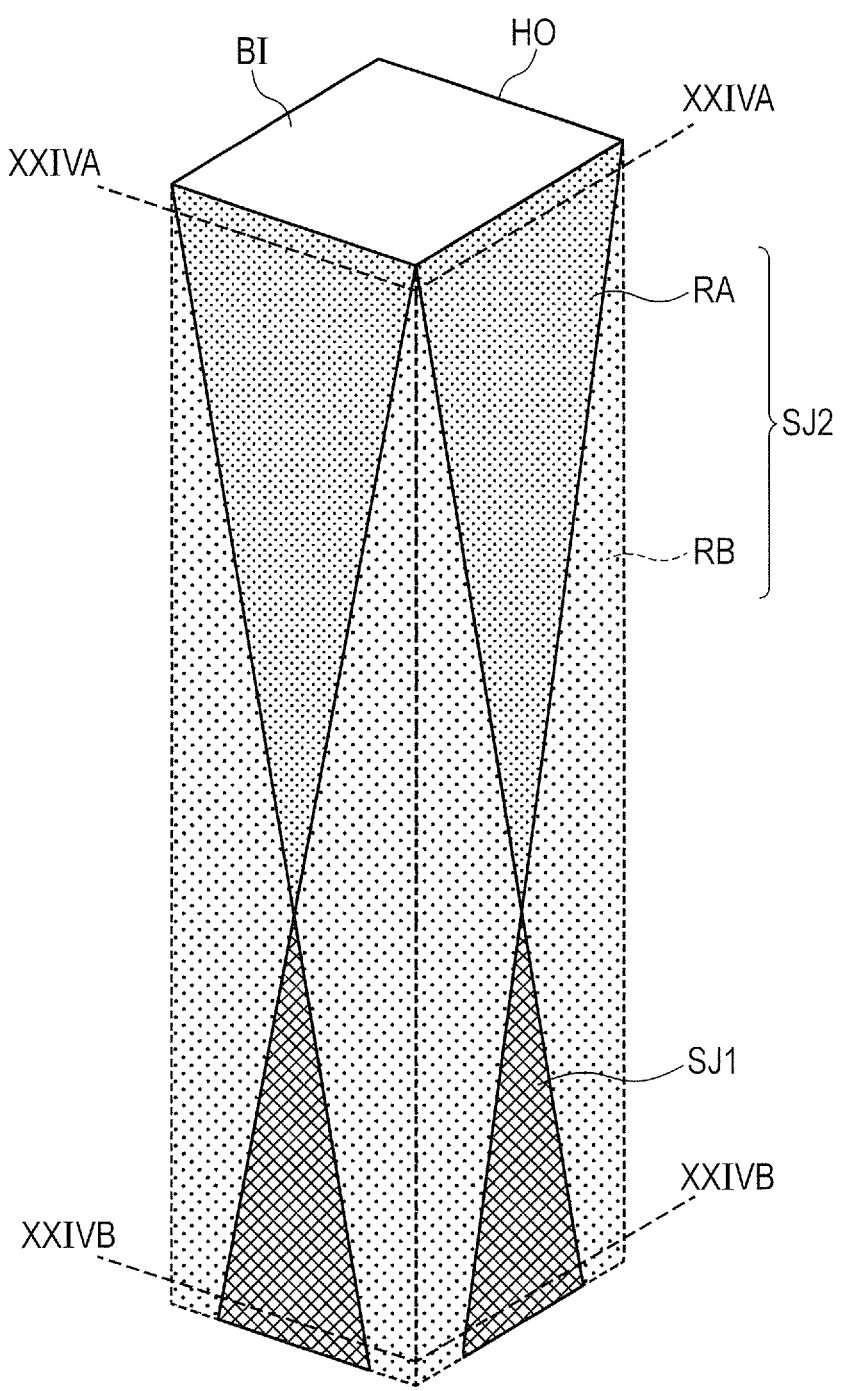
FIG. 23 is a perspective view showing the structure of a semiconductor device in a third embodiment, specifically, showing the distribution of high-concentration regions along wall surfaces of a hole portion.

As shown in FIG. 23, in this embodiment, the depth of the high-concentration region RA from the front surface S1 of the semiconductor substrate SUB is shallower than the depth of the hole portion HO from the front surface S1 of the semiconductor substrate SUB. Thus, the high-concentration region RA is formed in an inverted triangle shape with its vertex positioned at a higher level than the bottom surface of the hole portion HO. Furthermore, there are regions at the wall surfaces of the hole portion HO where p-type impurities are hardly implanted, in other words, the n-type regions SJ1 are distributed.

Figure 24A:
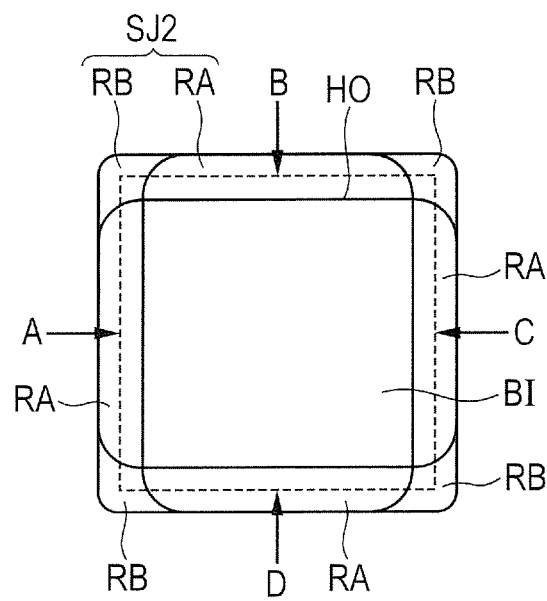
FIG. 24A shows the hole portion and a p-type region taken along the line XXIVA-XXIVA of FIG. 23.
Figure 24B:
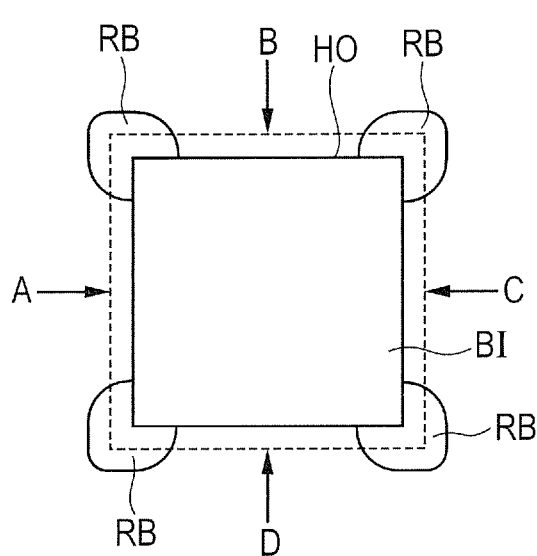
FIG. 24B shows the hole portion and a p-type region taken along the line XXIVB-XXIVB of FIG. 23.
Figure 25:
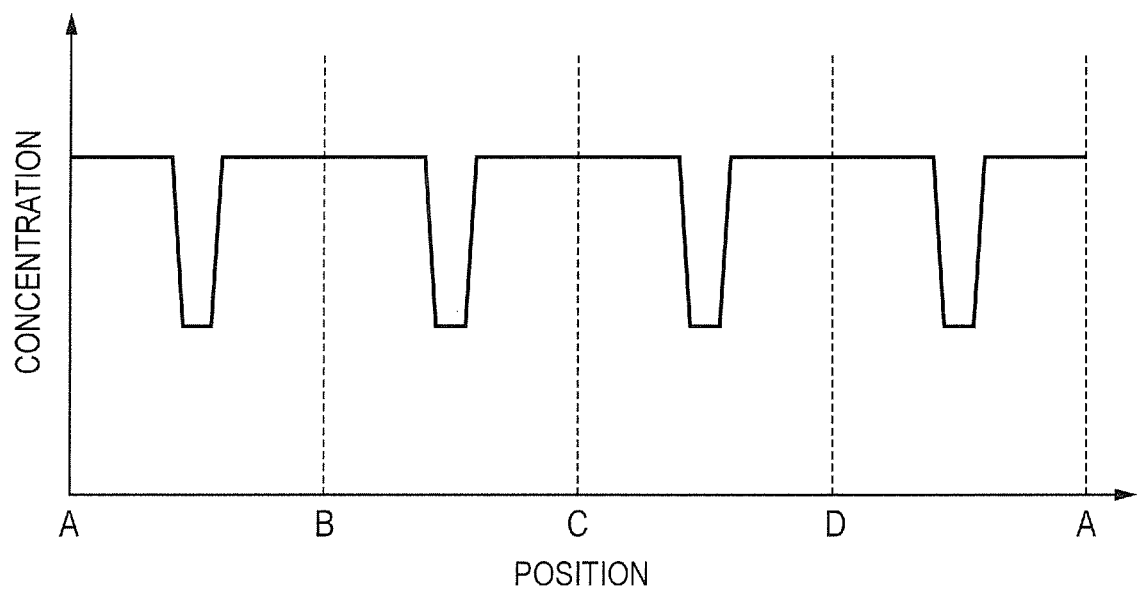
FIG. 25 shows an impurity concentration distribution along the dashed line in FIG. 24A.
Figure 26:
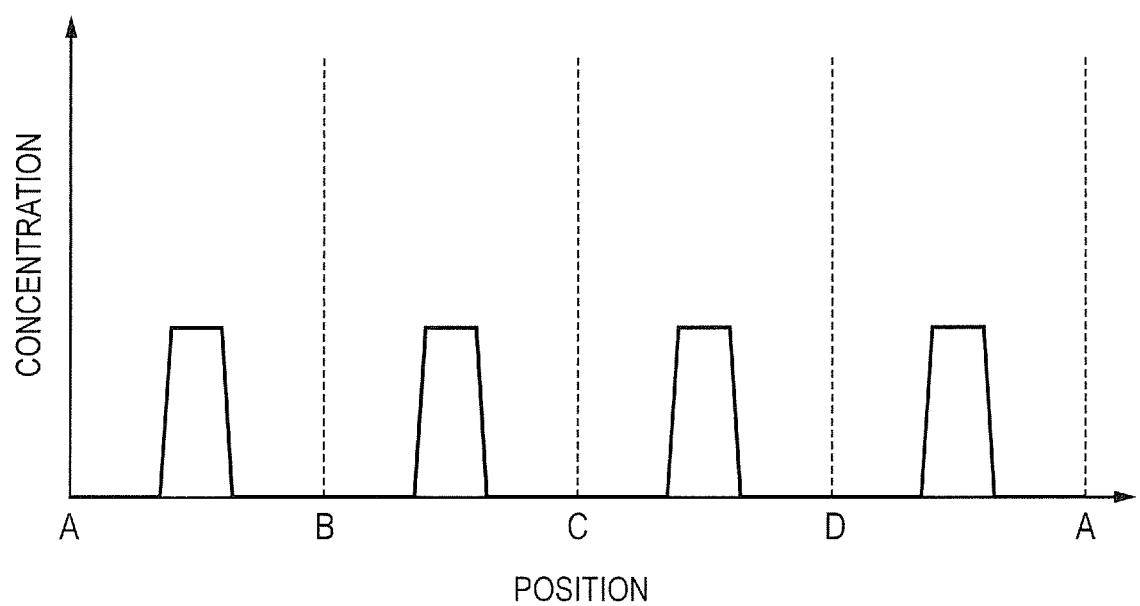
FIG. 26 shows an impurity concentration distribution along the dashed line in FIG. 24B.

As shown in FIGS. 24A and 25, the distribution of the p-type region SJ2 at the front surface S1 of the semiconductor substrate SUB in this embodiment is substantially the same as the distribution of the p-type region SJ2 in the first embodiment shown in FIGS. 5A and 6. However, as shown in FIGS. 24B and 26, the distribution of the p-type region SJ2 at the bottom surface of the hole portion HO in this embodiment is different from the distribution of the p-type region SJ2 in the first embodiment shown in FIGS. 5B and 7. Specifically, as shown in FIGS. 24B and 26, at the bottom surface of the hole portion HO in this embodiment, the low-concentration regions RB are positioned only at the corners of the hole portion HO, and regarding other regions of the hole portion HO, the n-type regions SJ1 are distributed around the hole portion HO.

Figure 27A:
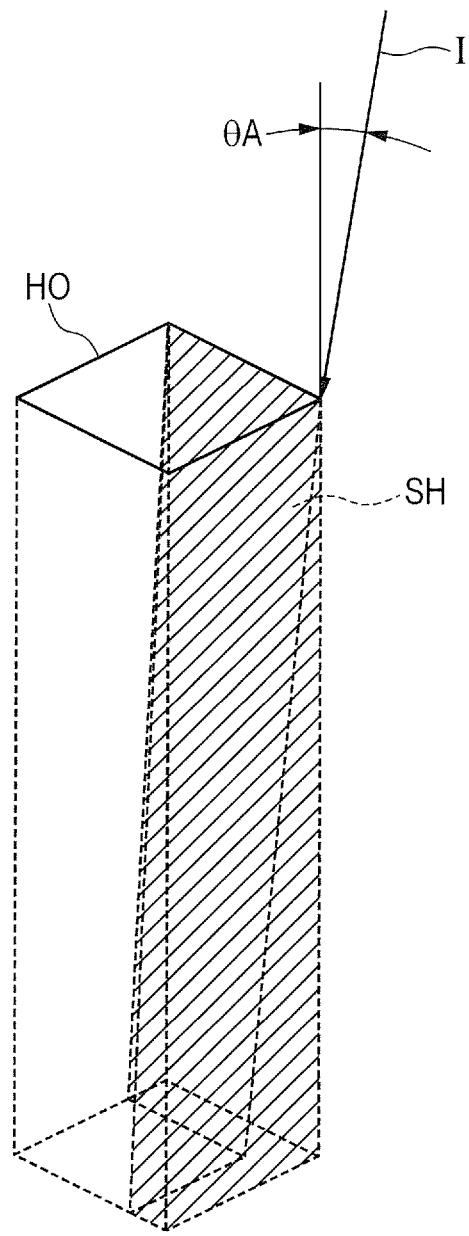
FIG. 27A is a diagram showing the state of the ion implantation step in the first embodiment.

The structure in this embodiment can be manufactured by increasing an inclination angle of implantation of the p-type impurities shown in FIG. 12, compared to that in the first embodiment. Specifically, as shown in FIG. 27A, when an inclination angle θA of the ion implantation relative to a vertical line to the front surface S1 of the semiconductor substrate SUB is small, a region SH (hatched region) where no ion is implanted is small, and thereby the p-type impurities are ion-implanted toward the deeper position. The structure of the first embodiment can be manufactured by ion implantation at an inclination angle θA shown in FIG. 27A.

Figure 27B:
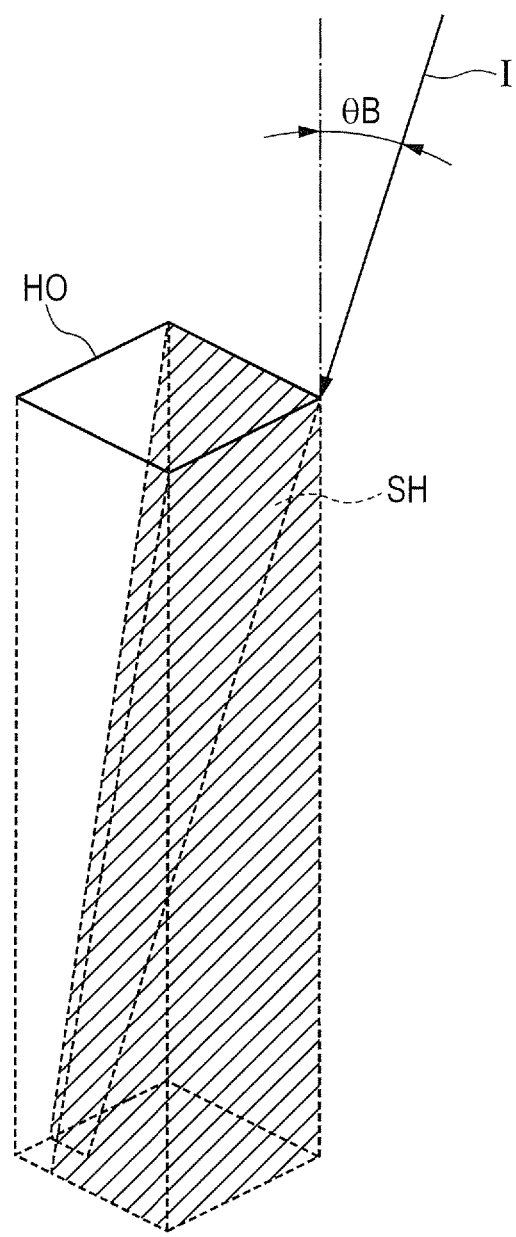
FIG. 27B is a diagram showing the state of the ion implantation step in the third embodiment.

On the other hand, as shown in FIG. 27B, as the ion implantation angle θB increases, the region SH (hatched region) where no ion is implanted is expanded, and thereby p-type impurities are ion-implanted only in shallow positions. The structure of this embodiment can be manufactured by ion implantation at the inclination angle θB shown in FIG. 27B.

In more detail, the inclination angle θ is obtained by the following formula:

$$\theta > \operatorname{atan}(W/d\sqrt{2}) \quad \text{(formula 1)}$$

where W is a length of one side of the hole portion HO; d is a depth of the hole portion HO; atan( ) is an arctangent function; and θ is represented in units of radian.

In this embodiment, the amount of p-type impurities on the side of the back surface S2 at the wall surfaces of the hole portion HO becomes extremely small. Thus, even when a voltage is applied to the side of the back surface S2, a region (n-type buffer region) where the n-type region SJ1 is not depleted can be formed. The addition of the n-type buffer region degrades the trade-off between the breakdown voltage and on-resistance, but can relieve the recovery characteristics of a diode. That is, a change dI/dt in the recovery current per time can be decreased. Thus, the structure can be obtained that enables high-speed switching and which is suitable for use in applications (inverter, and switching power source) for performing the high-speed switching.

Fourth Embodiment

Figure 28:
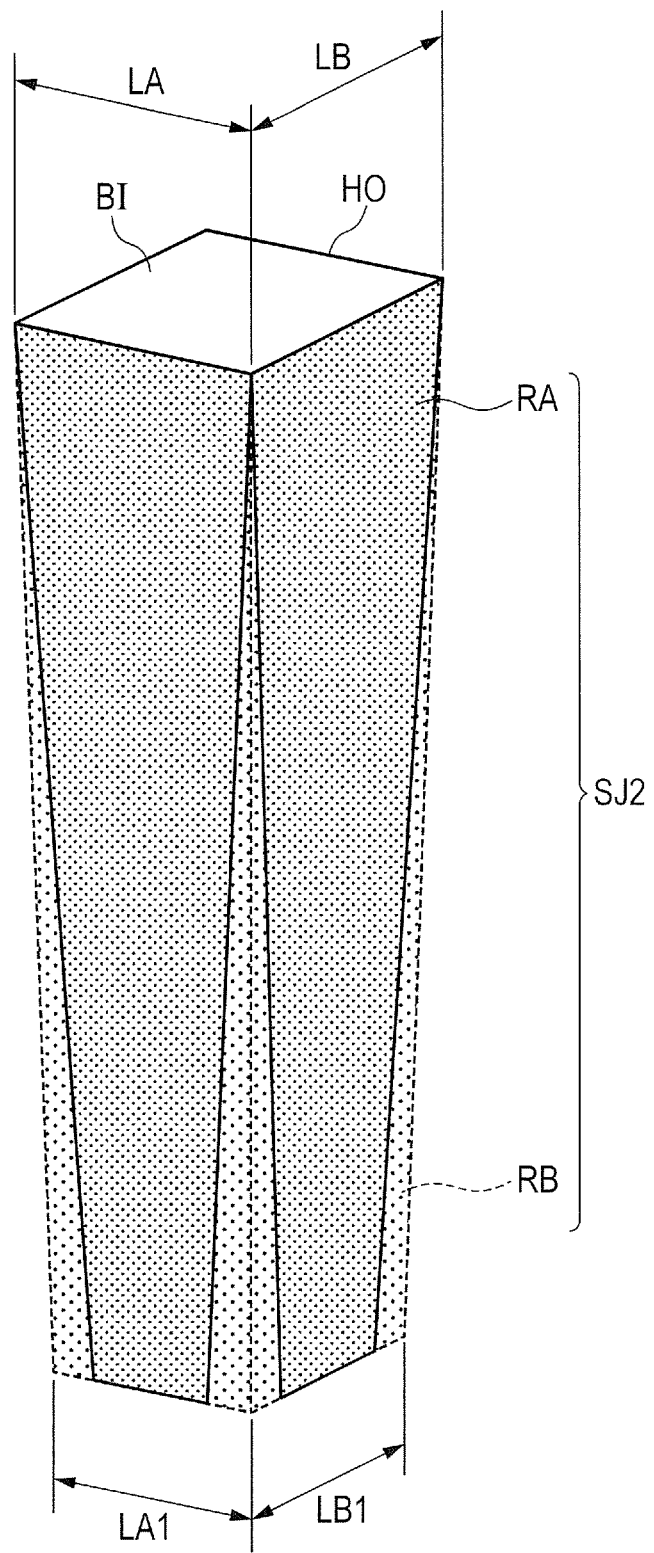
FIG. 28 is a perspective view showing the structure of a semiconductor device in a fourth embodiment, specifically, showing the distribution of high-concentration regions along wall surfaces of a hole portion.

As shown in FIG. 28, this embodiment, as will be seen by comparison, differs from the first embodiment in that the hole portion HO has a tapered shape. Specifically, a planar occupied area of the hole portion HO becomes smaller from the front surface S1 of the semiconductor substrate SUB to a deeper position toward the bottom surface of the hole portion HO. Thus, the length LA1 (or LB1) of one side of the hole portion HO at the bottom surface of the hole portion HO is smaller than the length LA (or LB) of one side of the hole portion HO at the front surface S1 of the semiconductor substrate SUB.

The term "planar occupied area" as used herein means an area occupied by the hole portion HO at a surface parallel with the front surface S1 of the semiconductor substrate.

Note that the structure of this embodiment is substantially the same as that of the first embodiment except for the above-mentioned points. The same components in this embodiment as those in the first embodiment are also designated by the same reference numerals as those used in the first embodiment, and thus a description thereof will not be repeated.

In this embodiment, the gradient of the impurity amounts between the upper and lower parts of the p-type region SJ2 can be set larger than that in the first embodiment. Thus, even when the p/n ratio deviates from the optimal conditions that make the breakdown voltage highest, the effect of preventing the breakdown voltage from being drastically decreased can be efficiently exhibited.

Fifth Embodiment

Figure 29:
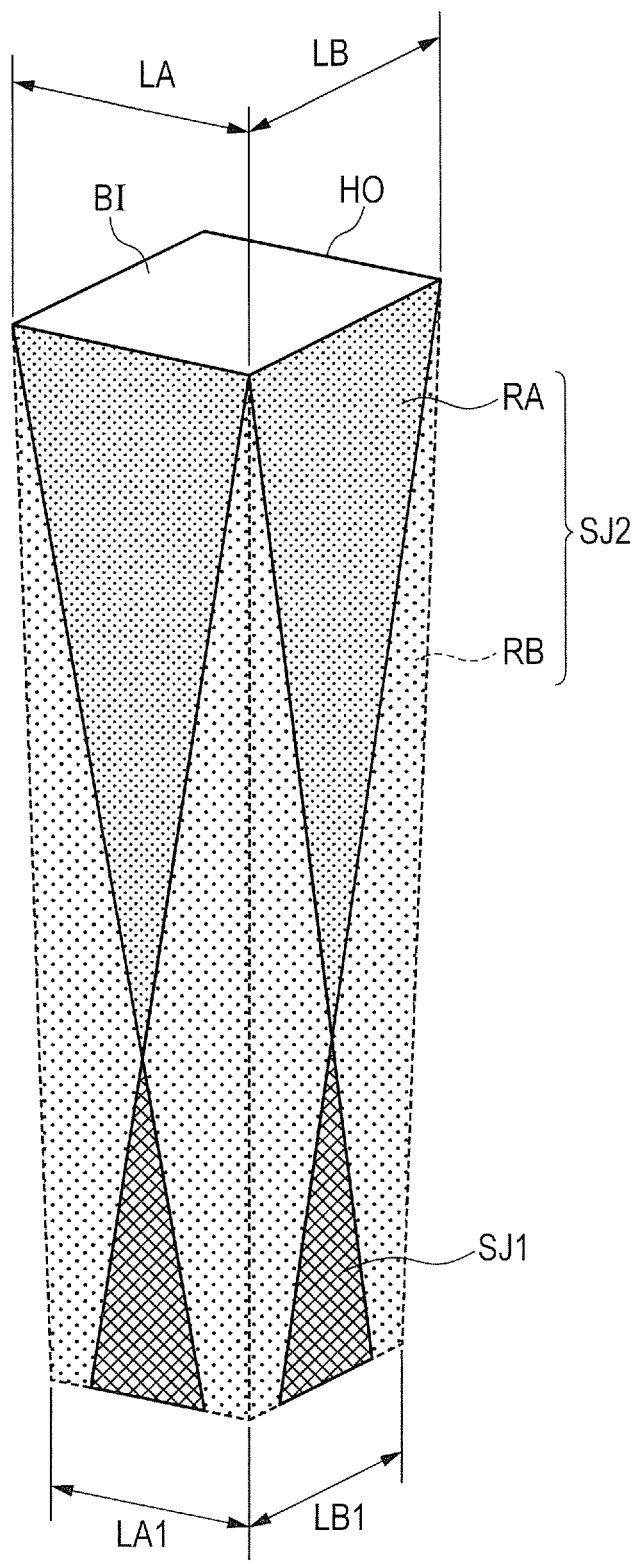
FIG. 29 is a perspective view showing the structure of a semiconductor device in a fifth embodiment, specifically, showing the distribution of high-concentration regions along wall surfaces of a hole portion.

As shown in FIG. 29, the structure in this embodiment is configured of a combination of the structure in the third embodiment and the structure in the fourth embodiment.

In the third embodiment, the inclination angle θ in the ion implantation direction needs to satisfy the relationship represented by the above-mentioned formula 1. As the angle θ increases, the high-concentration region RA becomes shallower, and the maximum breakdown voltage becomes lower. To make the depth d of the high-concentration region RA larger, the length W of one side of the hole portion HO needs to be increased. However, when the length W is increased, the area of the hole portion HO becomes larger, which might require the CVD step a number of times in the filling step of the hole portion HO, making the manufacture steps complicated.

In contrast, in this embodiment, the hole portion HO has a tapered shape. Because of this, even when the length W of one side of the hole portion HO is small, the depth of the necessary high-concentration region RA can be produced.

Sixth Embodiment

Figure 30:
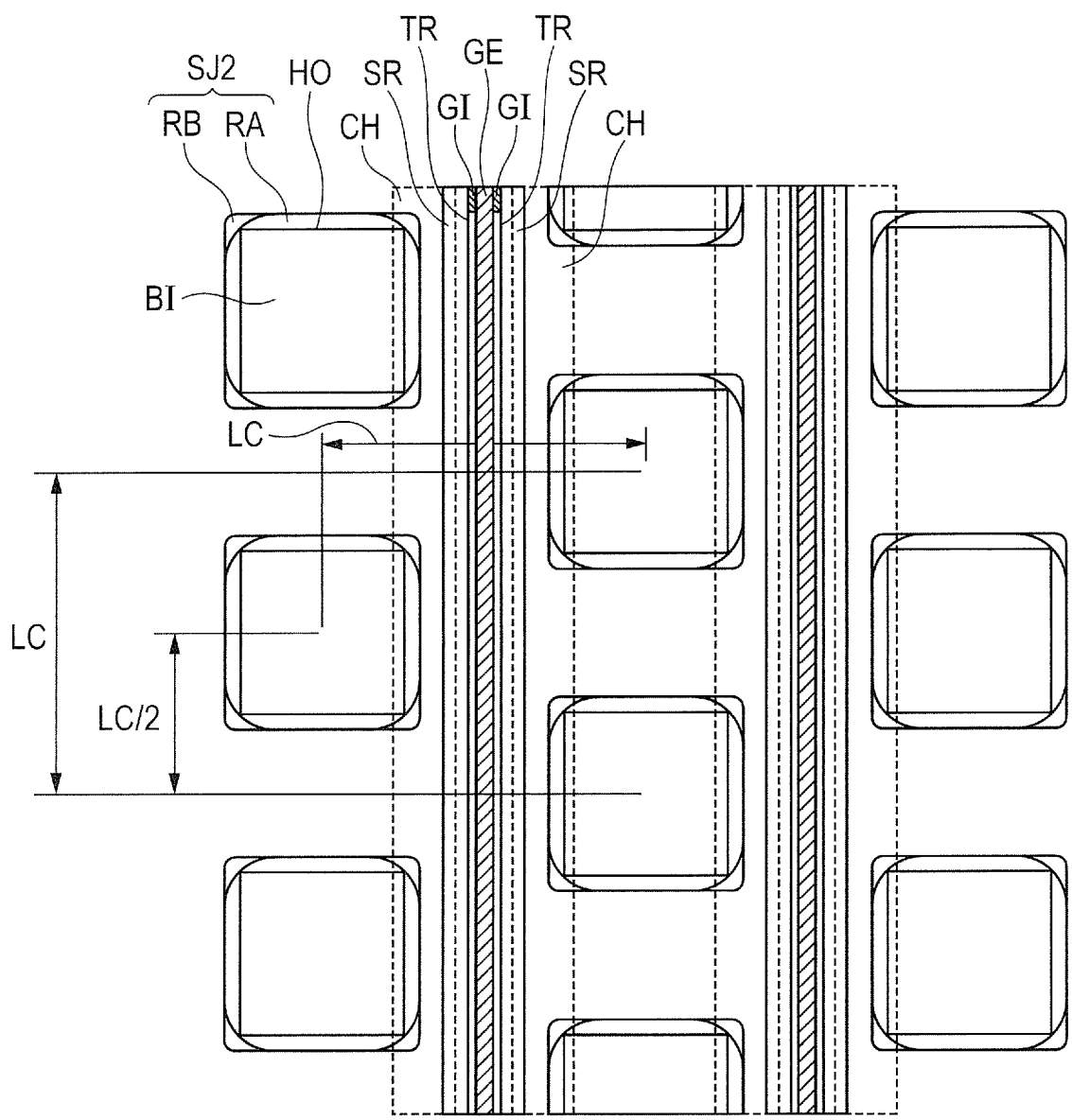
FIG. 30 is a diagram showing the structure of a semiconductor device in a sixth embodiment, specifically, an enlarged plan view corresponding to FIG. 2.

As shown in FIG. 30, the structure of this embodiment, as will be seen by comparison, differs from the structure of the first embodiment in the planar layout of the hole portions HO. Specifically, in this embodiment, the hole portions HO are arranged in a staggered pattern. The staggered arrangement means that the hole portions HO in a first line are shifted by half hole-pitch LC (LC/2) from the hole portions HO in a second line adjacent to the first line.

Note that the structure of this embodiment is substantially the same as that of the first embodiment except for the above-mentioned points. The same components in this embodiment as those in the first embodiment are also designated by the same reference numerals as those used in the first embodiment, and thus a description thereof will not be repeated.

In the planar layout of the hole portions HO in the first embodiment shown in FIG. 2, a distance between one hole portion HO and another hole portion HO adjacent thereto in an oblique direction is $\sqrt{2} \cong 1.4$ times as long as a distance between the hole portion HO and a further hole portion HO adjacent thereto in an up-down direction. Meanwhile, in this embodiment, a distance between one hole portion HO and another hole portion HO adjacent thereto in an oblique direction is $\sqrt{5}/2 \cong 1.1$ times as long as a distance between the hole portion HO and a further hole portion HO adjacent thereto in an up-down direction. That is, in this embodiment, the distance between the hole portions HO adjacent to each other in the up-down direction is substantially the same as the distance between the hole portions HO adjacent to each other in the oblique directions. Since the distances between the adjacent hole portions HO are set the same as much as possible, the n-type regions SJ1 can be depleted equally. Thus, the n-type impurity concentration in the n-type regions SJ1 can be increased, compared to a structure having the same breakdown voltage, so that the power MOSFET with a lower on-resistance can be achieved.

Seventh Embodiment

Figure 31:
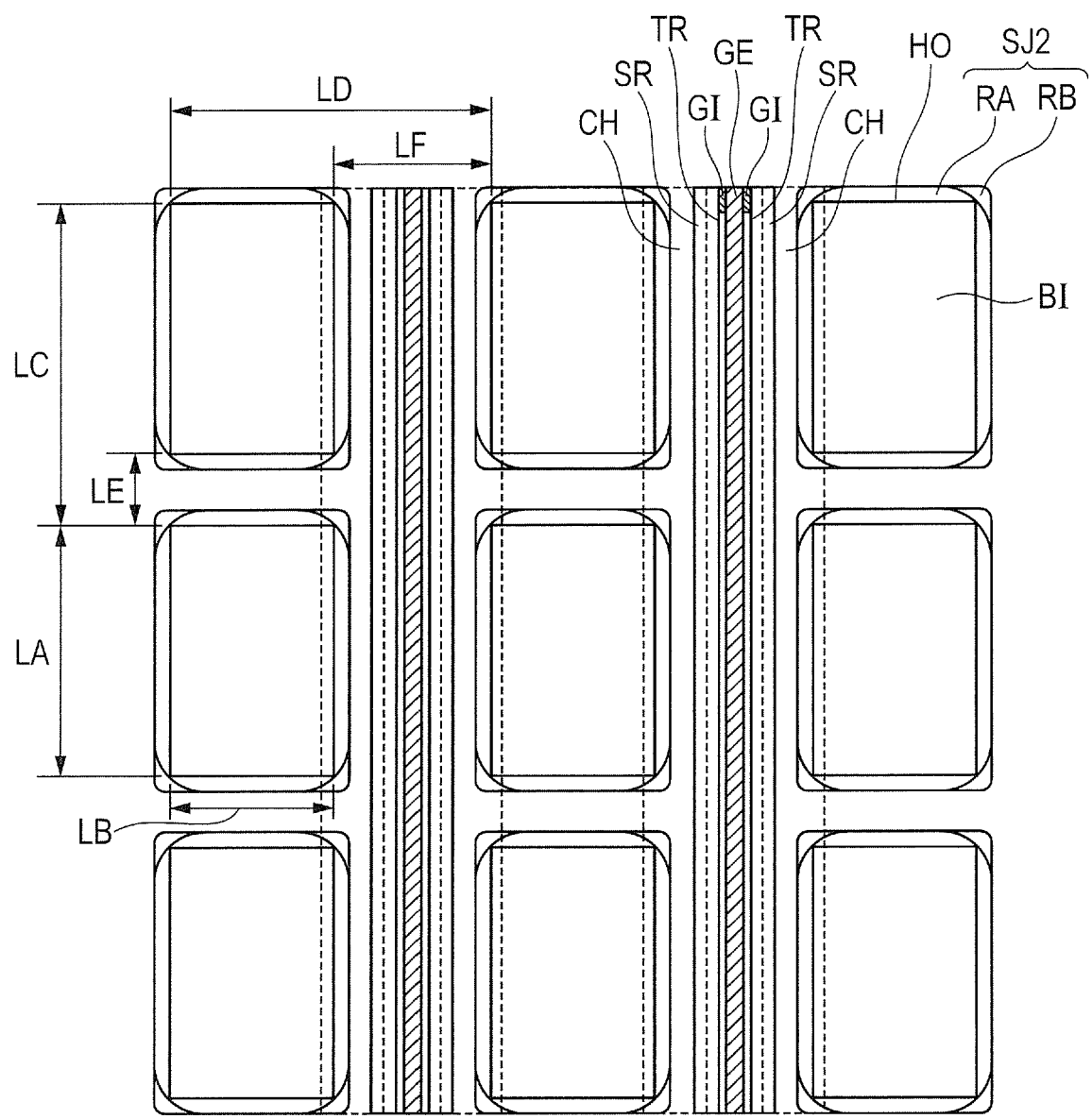
FIG. 31 is a diagram showing the structure of a semiconductor device in a seventh embodiment, specifically, an enlarged plan view corresponding to FIG. 2.

As shown in FIG. 31, the structure of this embodiment, as will be seen by comparison, differs from the structure of the first embodiment in the planar shape of the hole portions HO. The planar shape of each hole portion HO in this embodiment is rectangular and has a long side with a dimension LA and a short side with a dimension LB (LB<LA). The side of the hole portion HO along the extending direction (up-down direction in the figure) of the gate electrode GE is the long side.

A hole pitch LC in the longitudinal direction in this embodiment is the same as a hole pitch LD in the lateral direction. However, as long as a hole distance LE in the longitudinal direction between the hole portions HO is not more than a hole distance LF in the lateral direction between the hole portions HO, the same effect can be obtained even if the hole pitch LC in the longitudinal direction is more than the hole pitch LD in the lateral direction.

Furthermore, like this embodiment, when intended to increase the dimension LA in the longitudinal direction of the hole portion HO, the longitudinal dimension LA is desirably smaller than a dimension that is 5.6 times as large as the depth of the hole portion HO. This is based on the following reasons.

Figure 32:
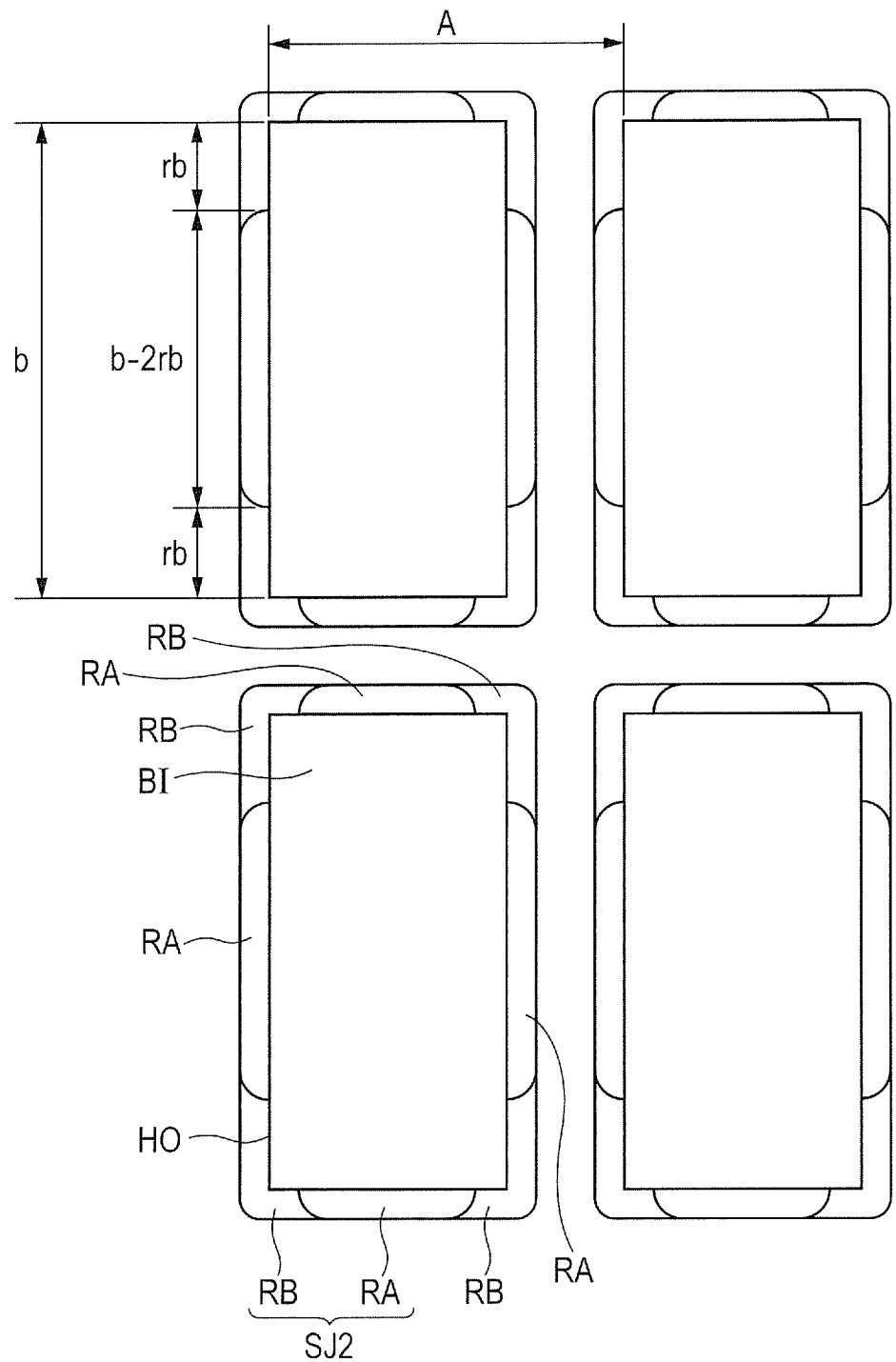
FIG. 32 is a diagram showing the structure of the semiconductor device in the seventh embodiment, specifically, a schematic cross-sectional view showing the cross section at the bottom surface of a hole portion.

As shown in FIG. 32, b is the length of the long side of the hole portion HO at the bottom surface of the hole portion HO, rb is the distance from an end of the high-concentration region RA to a corner (end) of the hole portion HO, and the width of the high-concentration region RA is set as b−2rb. In this case, the gradient of the impurity amount appears only near the corner of the hole portion HO. When the high-concentration region RA becomes longer to some extent, the vicinity of the center of the high-concentration region RA does not exhibit the effect by the gradient of the impurity amount. Desirably, the distance from both ends of the high-concentration region RA to its center should be smaller than a hole pitch A in the lateral direction. That is, the relationship given by formula 2 below is preferably satisfied.

$$b-2rb<2A \qquad \text{(formula 2)}$$

In accordance with the above formula 2, the relationship of b(1−2r)/2<A is preferably satisfied. Meanwhile, to obtain the lower conduction resistance in the superjunction structure than in the normal p-n junction, the hole pitch A in the lateral direction and a depth d of the hole portion HO need to satisfy the relationship represented by formula 3 below.

$$d/A>0.72 \qquad \text{(formula 3)}$$

In accordance with the above formula 3, the relationship of A<d/0.72 needs to be satisfied. As can be seen from the combination of the formulas 2 and 3, the following relationship of b(1−2r)/2<d/0.72, i.e., b<2d/0.72/(1−2r) is necessary.

The d has its optimal value (upper limit) determined by the breakdown voltage of the superjunction structure, and thereby the upper limit of the b value is determined by a degree (r) of the gradient of a profile shape (r≤0.5; the larger the r, the larger the b also becomes.) When the gradient of the impurity amount is extremely large, the reduction in the maximum breakdown voltage becomes significant, which eliminates the effect of lowering the sensitivity of reduction in the breakdown voltage with respect to the p/n ratio, which would otherwise be an intrinsic merit. Supposing that the maximum r is 0.25 (which corresponds to a change of 25% in terms of the impurity amount ratio), the above-mentioned formula leads to b<2d/0.72/(1−2×0.25)=5.56×d. That is, the length b in the longitudinal direction of the hole portion HO is desirably smaller than a value that is approximately 5.6 times as long as the depth d of the hole portion HO.

Figure 33A:
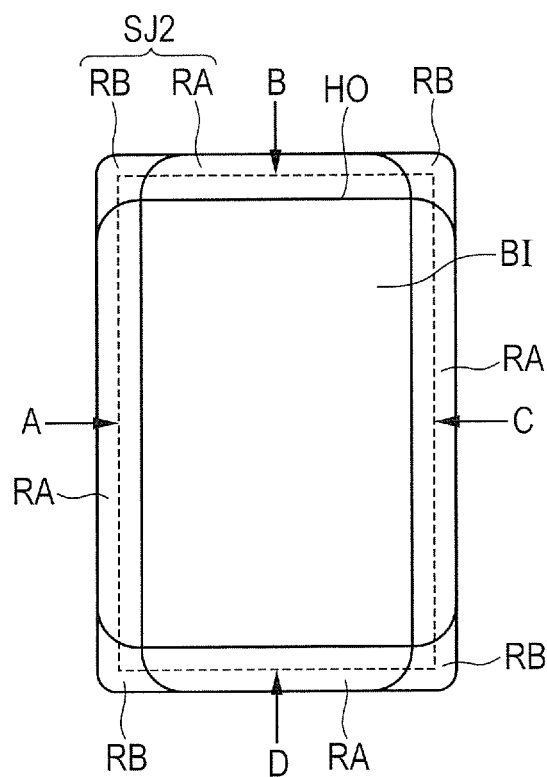
FIG. 33A shows the hole portion and a p-type region at the front surface of the semiconductor substrate in the seventh embodiment.
Figure 33B:
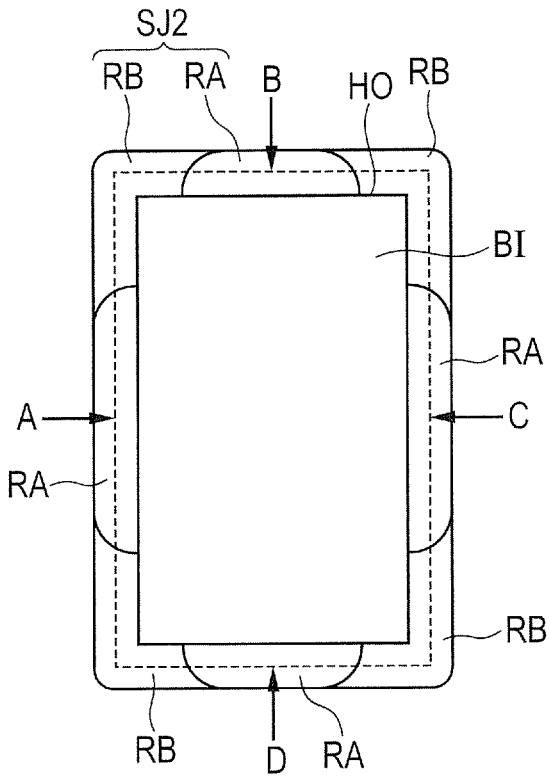
FIG. 33B shows the hole portion and the p-type region at the bottom surface of the hole portion in the seventh embodiment.

As shown in FIGS. 32, 33A, and 33B, each p-type region SJ2 has high-concentration regions RA and low-concentration regions RB. A width of the high-concentration region RA along the wall surface of the hole portion HO becomes smaller from the front surface S1 of the semiconductor substrate SUB toward a deeper position. Thus, the width LA2 (or LB2) of the high-concentration region RA at the bottom surface of the hole portion HO is smaller than the width LA (or LB) of the high-concentration region RA at the front surface S1 of the semiconductor substrate SUB.

The high-concentration region RA at the wall surface of the hole portion HO has a trapezoidal shape. In the trapezoidal shape, one of its parallel opposed sides (side at the front surface S1) is longer, while the other (side at the bottom surface of the hole portion HO) is shorter.

A width of the low-concentration region RB along the wall surface of the hole portion HO increases from the front surface S1 of the semiconductor substrate SUB toward a deeper position. Thus, the width of the low-concentration region RB at the bottom surface of the hole portion HO is larger than the width (for example, 0 (zero)) of the low-concentration region RB at the front surface S1 of the semiconductor substrate SUB.

The depth of each of the high-concentration region RA and the low-concentration region RB from the front surface S1 is equal to or deeper than the depth from the front surface S1 of the hole portion HO.

As shown in FIG. 33A, the width LA (or LB) of the high-concentration region RA at the front surface S1 of the semiconductor substrate SUB is equal to the length LA (or LB) of one side of the hole portion HO at the front surface S1 of the semiconductor substrate SUB. That is, the high-concentration region RA is disposed along the entire length of one side of the hole portion HO at the front surface S1 of the semiconductor substrate SUB.

The low-concentration region RB is disposed only at the corner of the hole portion HO at the front surface S1 of the semiconductor substrate SUB.

As shown in FIG. 34B, the width of the high-concentration region RA at the bottom surface of the hole portion HO is smaller than the length of one side of the hole portion HO at the bottom surface of the hole portion HO. That is, at the bottom surface of the hole portion HO, the high-concentration region RA is disposed only over a part of one side (only the center part of one side) of the hole portion HO.

At the bottom surface of the hole portion HO, the low-concentration regions RB are disposed at the corners and both ends of each side of the hole portion HO.

Figure 34:
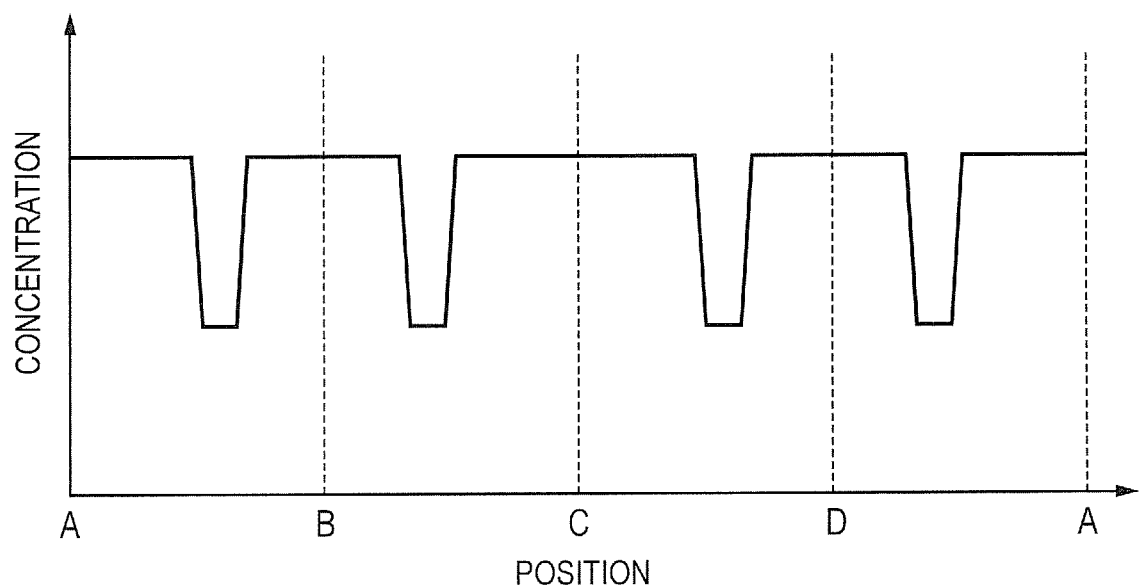
FIG. 34 shows an impurity concentration distribution along the dashed line in FIG. 33A.
Figure 35:
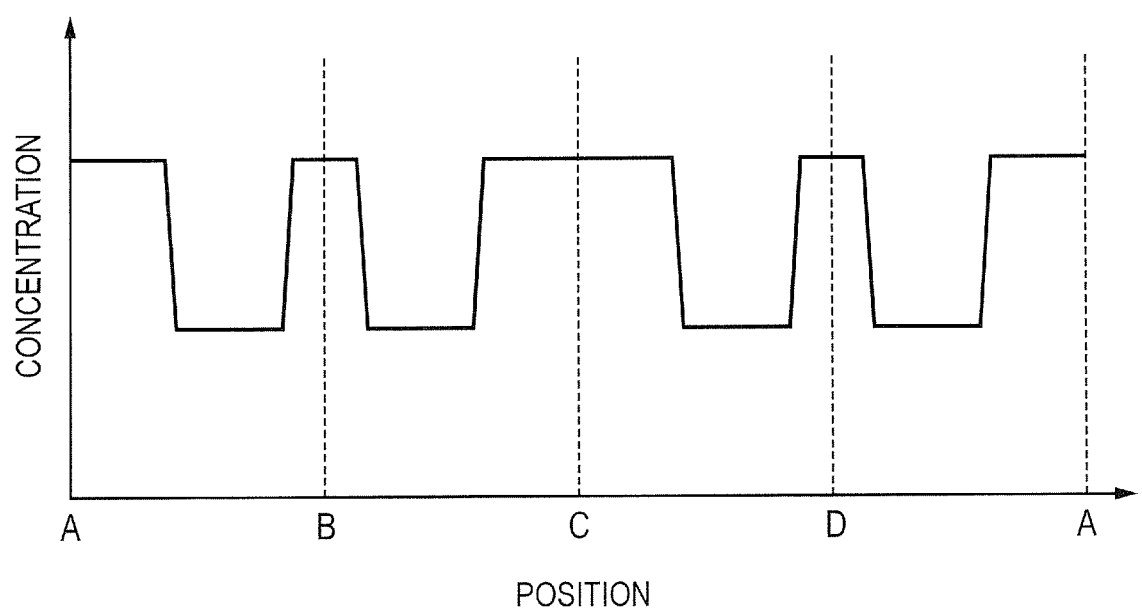
FIG. 35 shows an impurity concentration distribution along the dashed line in FIG. 33B.

As shown in FIG. 34, at the front surface S1 of the semiconductor substrate SUB, the low-concentration regions RB are positioned only at the corners of the hole portion HO, whereby only the p-type impurity concentration only at these parts is lower than that in other parts. As shown in FIG. 35, at the bottom part of the hole portion HO, the low-concentration regions RB are positioned only at the corners of the hole portion HO and both ends of each side of the hole portion HO, whereby the p-type impurity concentration located only at these parts is lower than that in other parts.

As shown in FIGS. 34 and 35, the p-type impurity concentration in the high-concentration region RA is approximately twice as high as that in the low-concentration region RB. Alternatively, the p-type impurity concentration in the high-concentration region RA may be twice or more times as high as that in the low-concentration region RB.

Note that the structure of this embodiment is substantially the same as that of the first embodiment except for the above-mentioned points. The same components in this embodiment as those in the first embodiment are also designated by the same reference numerals as those used in the first embodiment, and thus a description thereof will not be repeated.

Also in this embodiment, like the sixth embodiment, the distance between the hole portions HO adjacent to each other in the oblique direction becomes smaller, so that the same effects as those in the sixth embodiment can be obtained.

When the planar shape of the hole portion HO is square as illustrated in FIG. 2, a small pattern width makes a resolution in the photolithography technique difficult. Furthermore, when filled with the insulating film by the CVD, the hole portion HO cannot be completely filled, which might disadvantageously generate voids in the insulating film BI. However, this embodiment can suppress the occurrence of such inconveniences.

Eighth Embodiment

Figure 36:
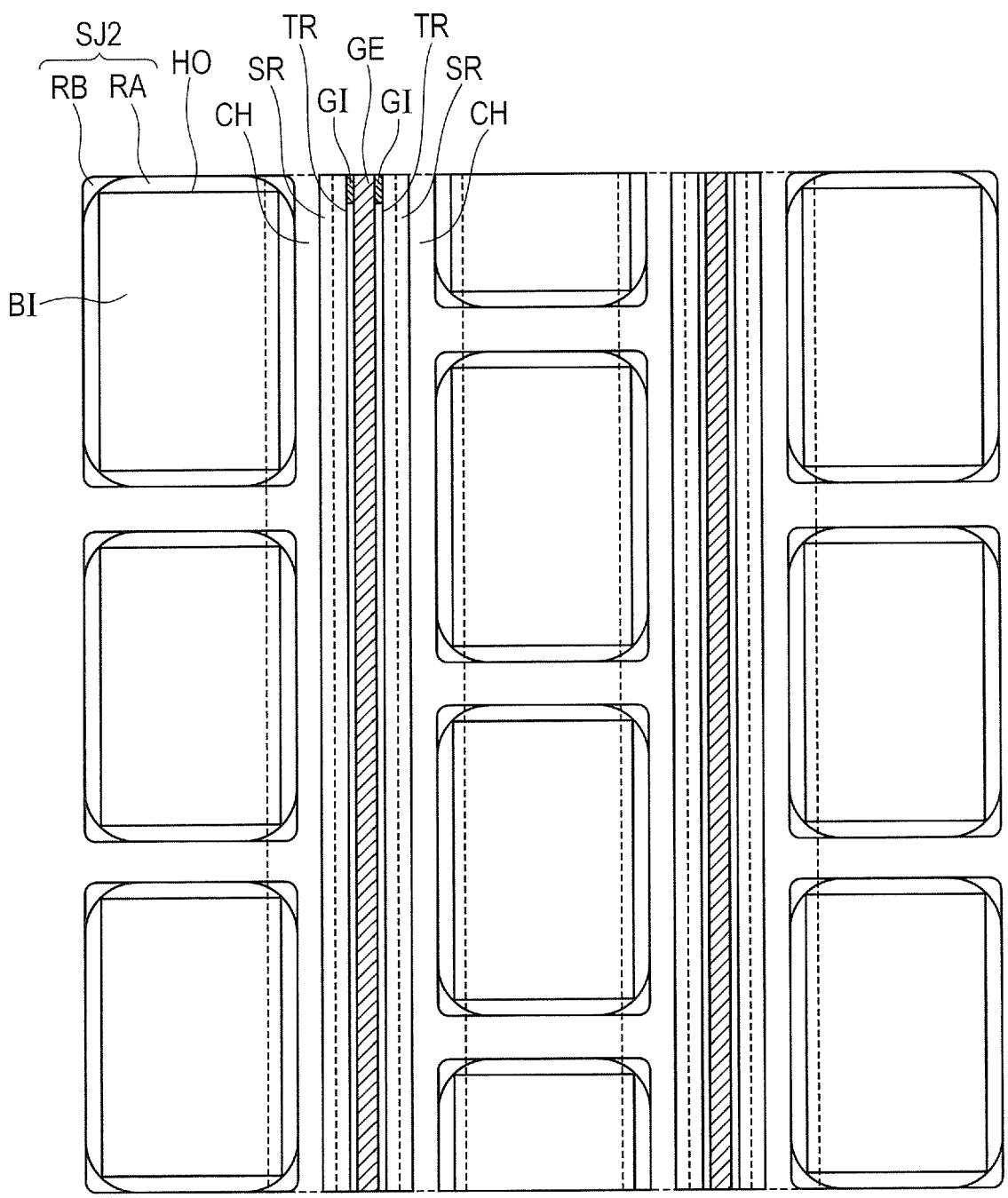
FIG. 36 is a diagram showing the structure of a semiconductor device in an eighth embodiment, specifically, an enlarged plan view corresponding to FIG. 2.

As shown in FIG. 36, the structure in this embodiment is configured of a combination of the structure in the sixth embodiment and the structure in the seventh embodiment. That is, the planar shape of the hole portion HO is rectangular, and the hole portions HO are arranged in a staggered pattern in the planar view.

Note that the structure of this embodiment is substantially the same as that of each of the sixth and seventh embodiments except for the above-mentioned points. The same components in this embodiment as those in the sixth and seventh embodiments are also designated by the same reference numerals as those used in these embodiments, and thus a description thereof will not be repeated.

In this embodiment, the distance between the adjacent hole portions HO becomes smaller than that in the seventh embodiment, thereby easily obtaining the higher breakdown voltage.

Ninth Embodiment

Figure 37:
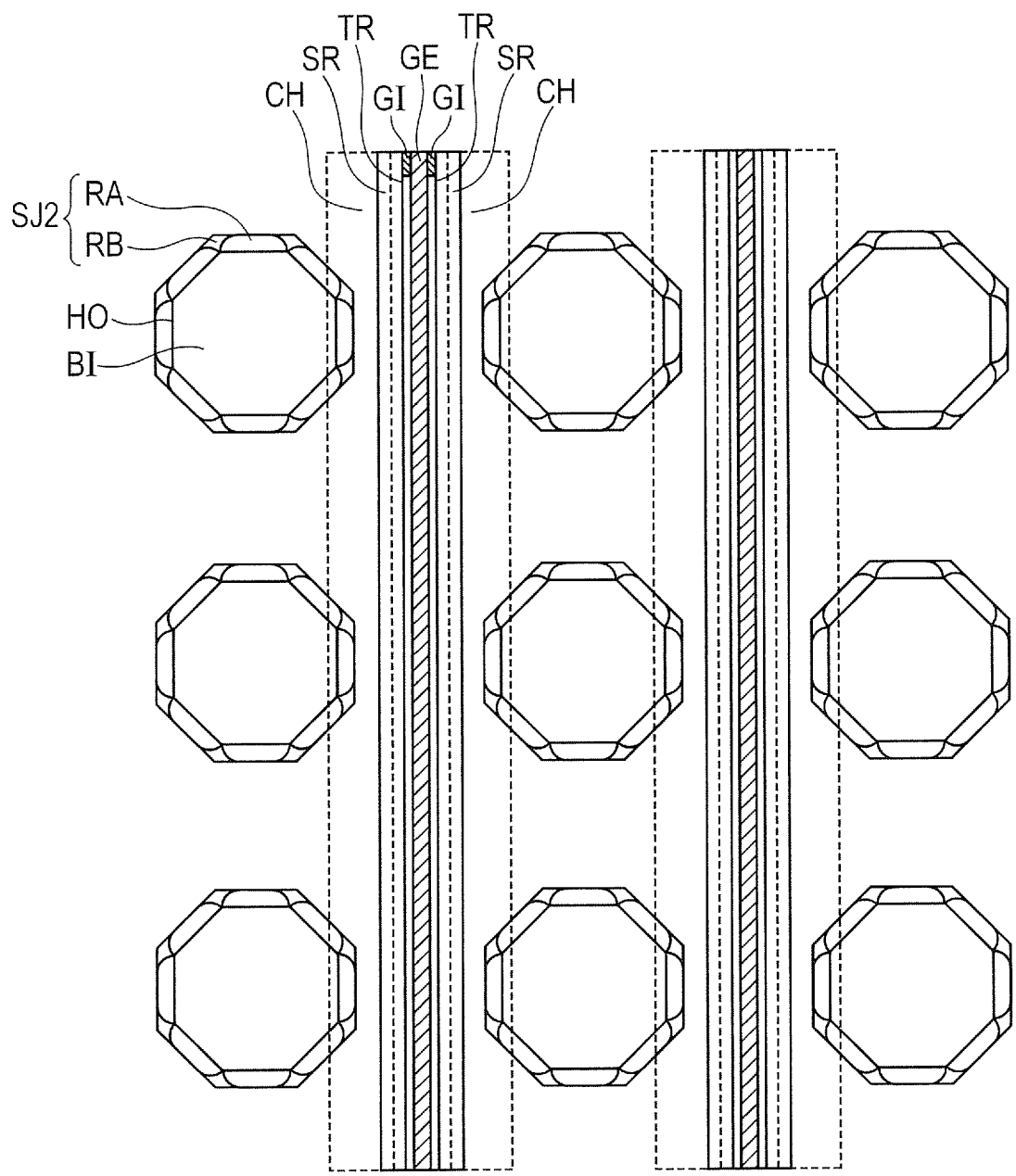
FIG. 37 is a diagram showing the structure of a semiconductor device in a ninth embodiment, specifically, an enlarged plan view corresponding to FIG. 2.
Figure 38:
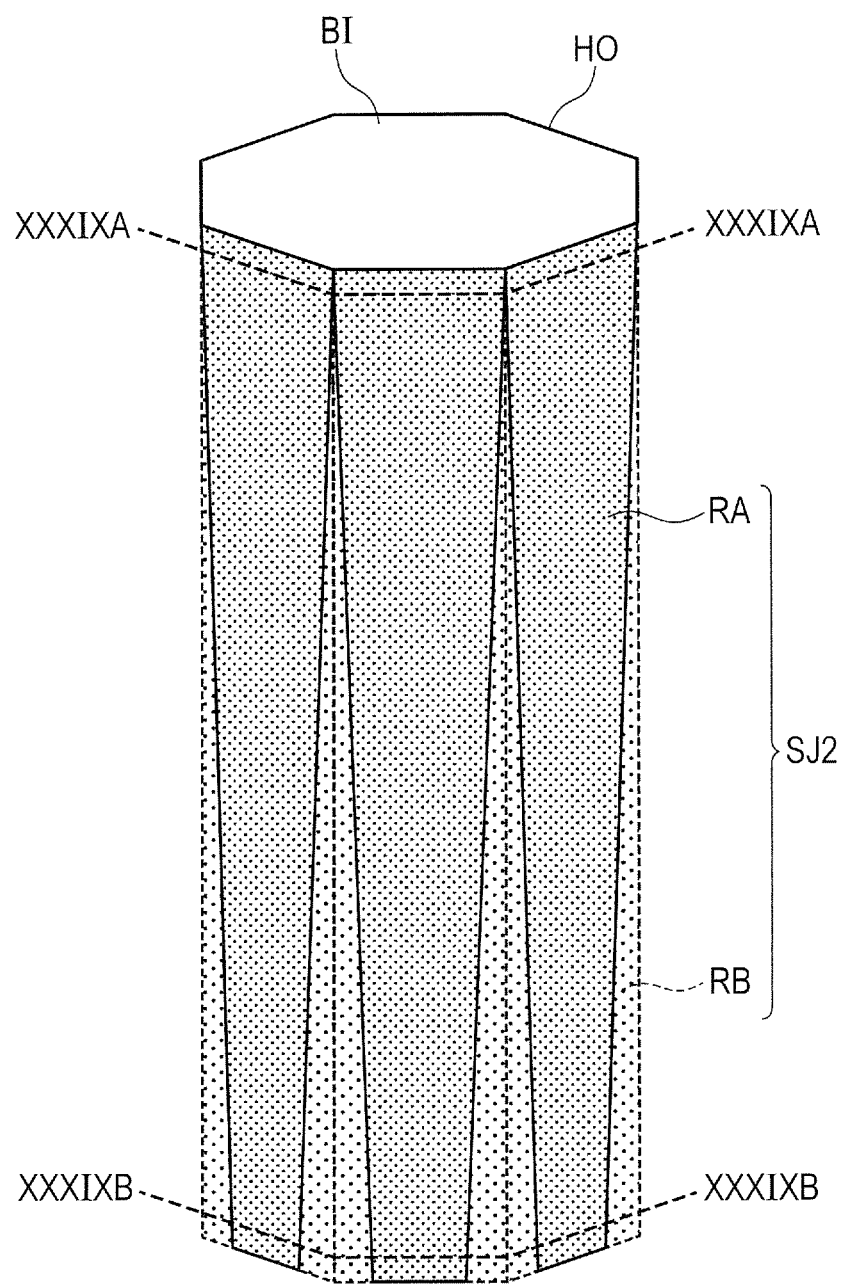
FIG. 38 is a diagram showing the structure of a semiconductor device in the ninth embodiment, specifically, a perspective view showing the distribution of high-concentration regions along inner walls of a hole portion.
Figure 39A:
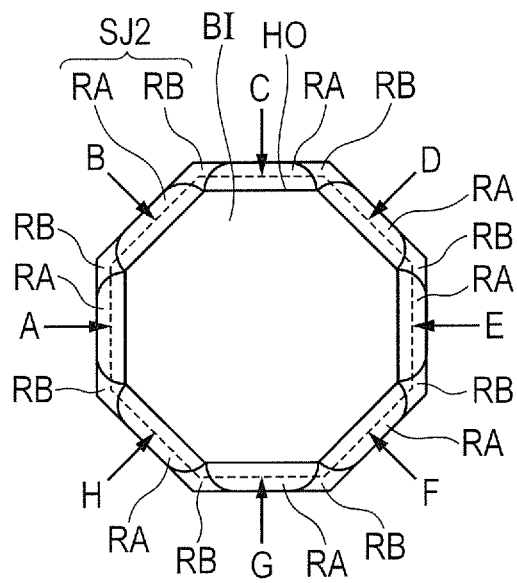
FIG. 39A shows the hole portion and a p-type region taken along the line XXXIXA-XXXIXA of FIG. 38.
Figure 39B:
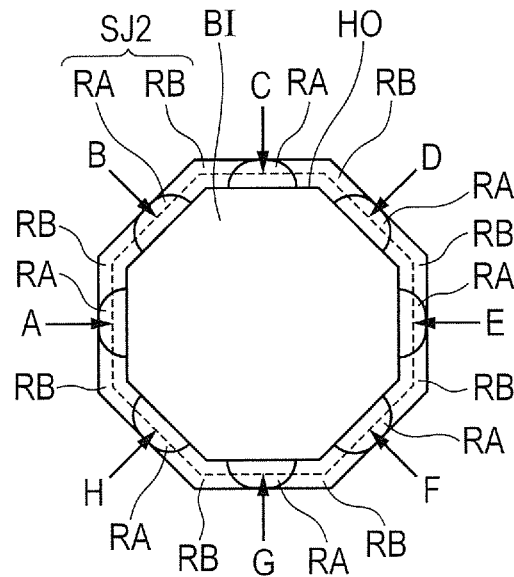
FIG. 39B shows the hole portion and a p-type region taken along the line XXXIXB-XXXIXB of FIG. 38.
Figure 40:
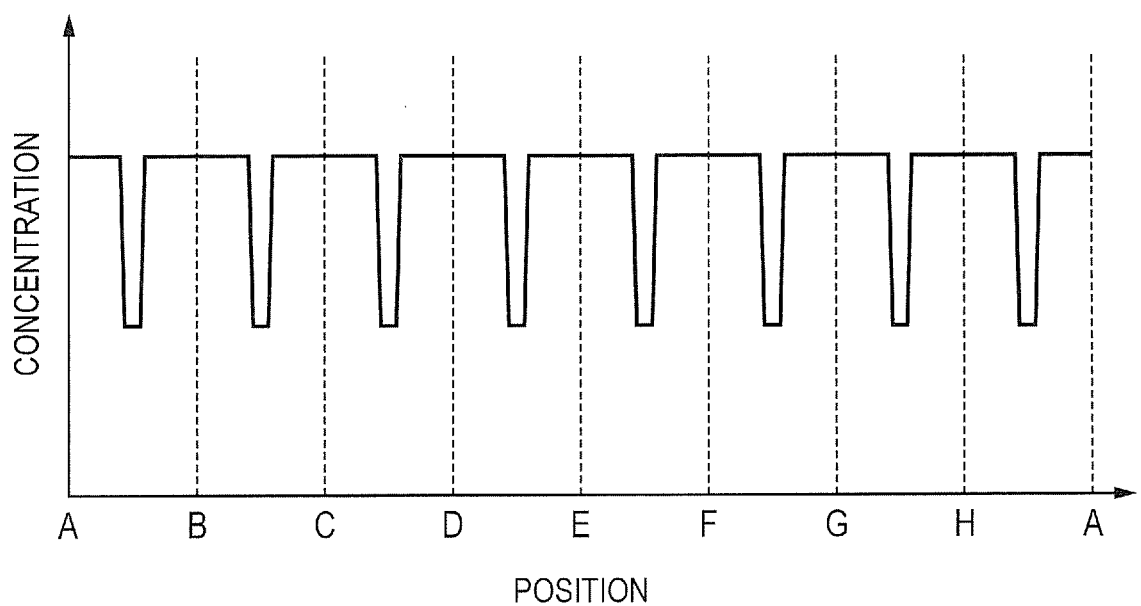
FIG. 40 shows an impurity concentration distribution along the dashed line in FIG. 39A.
Figure 41:
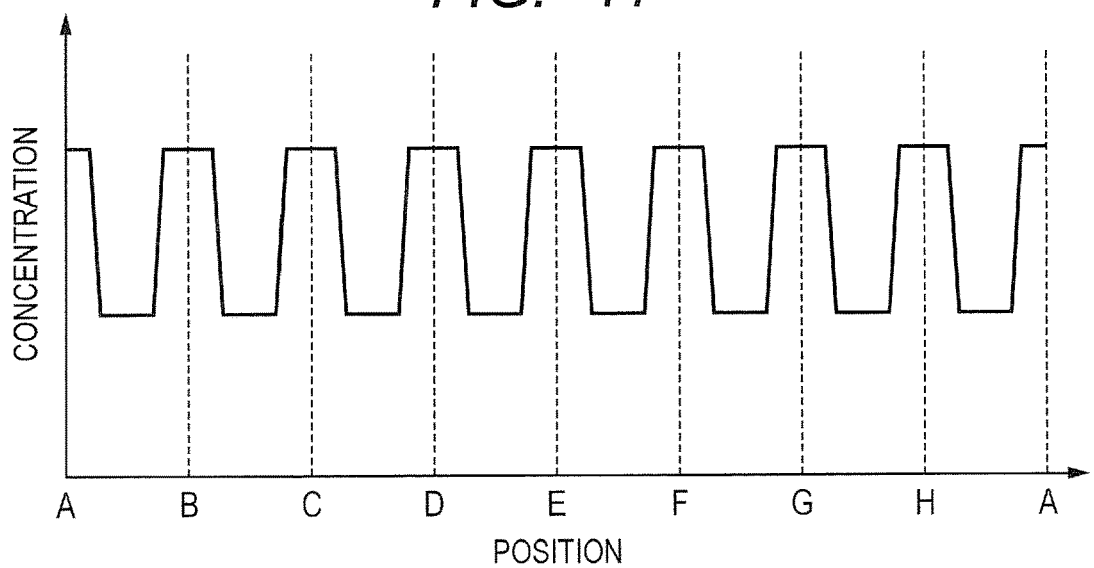
FIG. 41 shows an impurity concentration distribution along the dashed line in FIG. 39B.

As shown in FIG. 37, the structure of this embodiment, as will be seen by comparison, differs from the first embodiment in the planar shape of the hole portions HO. The planar shape of each hole portion HO in this embodiment is octagonal.

As shown in FIGS. 38 to 41, each side (each side surface) of the octagonal hole portion HO is provided with the high-concentration region RA and the low-concentration region RB. The state of the distribution of the high-concentration region RA and low-concentration region RB at each side (each side surface) is the same as that in the first embodiment.

In the manufacturing method of this embodiment, ion implantation is performed from the direction perpendicular to each side surface of the octagonal shape in the planar view (ion implantation is performed eight times in total.) Thus, the p-type regions SJ2, each including the high-concentration region RA and the low-concentration region RB, are formed as shown in FIGS. 37 to 41.

Note that the structure and manufacturing method in this embodiment are substantially the same as those in the first embodiment except for the above-mentioned points. The same components in this embodiment as those in the first embodiment are also designated by the same reference numerals as those used in the first embodiment, and thus a description thereof will not be repeated.

In this embodiment, the p-type impurity concentration in the high-concentration region RA, formed at each side surface of the hole portion HO, is made uniform, as compared to the first embodiment. Thus, the n-type region SJ1 can be depleted more uniformly, which can achieve a power MOSFET that exhibits a lower resistance even with the same breakdown voltage, like the sixth embodiment.

Tenth Embodiment

Figure 42:
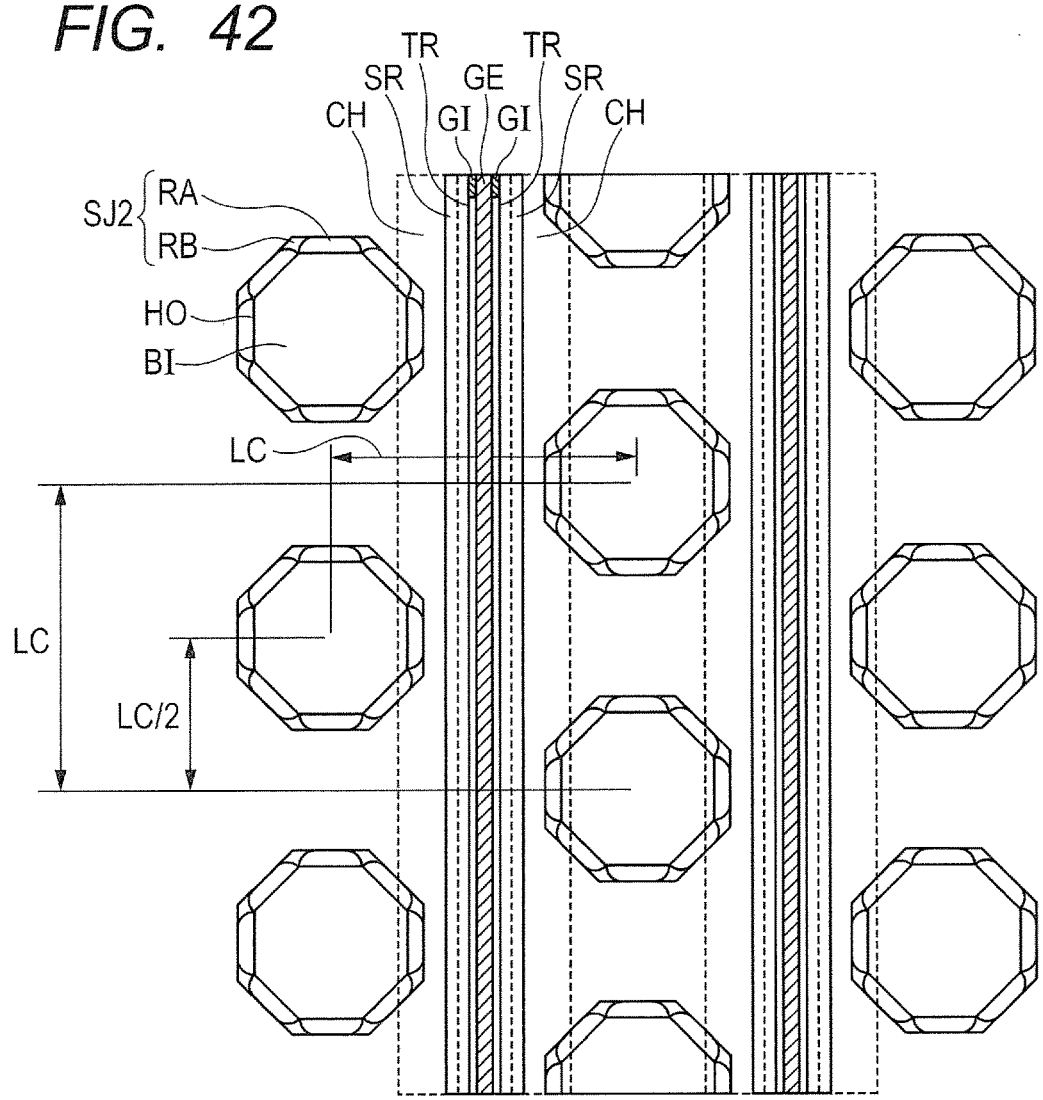
FIG. 42 is a diagram showing the structure of a semiconductor device in a tenth embodiment, specifically, an enlarged plan view corresponding to FIG. 2.

As shown in FIG. 42, the structure in this embodiment is configured of a combination of the structure in the sixth embodiment and the structure in the ninth embodiment. That is, the planar shape of each hole portion HO is octagonal, and the hole portions HO are arranged in a staggered pattern in the planar view.

Note that the structure of this embodiment is substantially the same as that of each of the sixth and ninth embodiments except for the above-mentioned points. The same components in this embodiment as those in the sixth and ninth embodiments are also designated by the same reference numerals as those used in these embodiments, and thus a description thereof will not be repeated.

In this embodiment, the distance between the adjacent hole portions HO becomes smaller than that in the ninth embodiment, thereby easily obtaining the higher breakdown voltage.

Eleventh Embodiment

Figure 43:
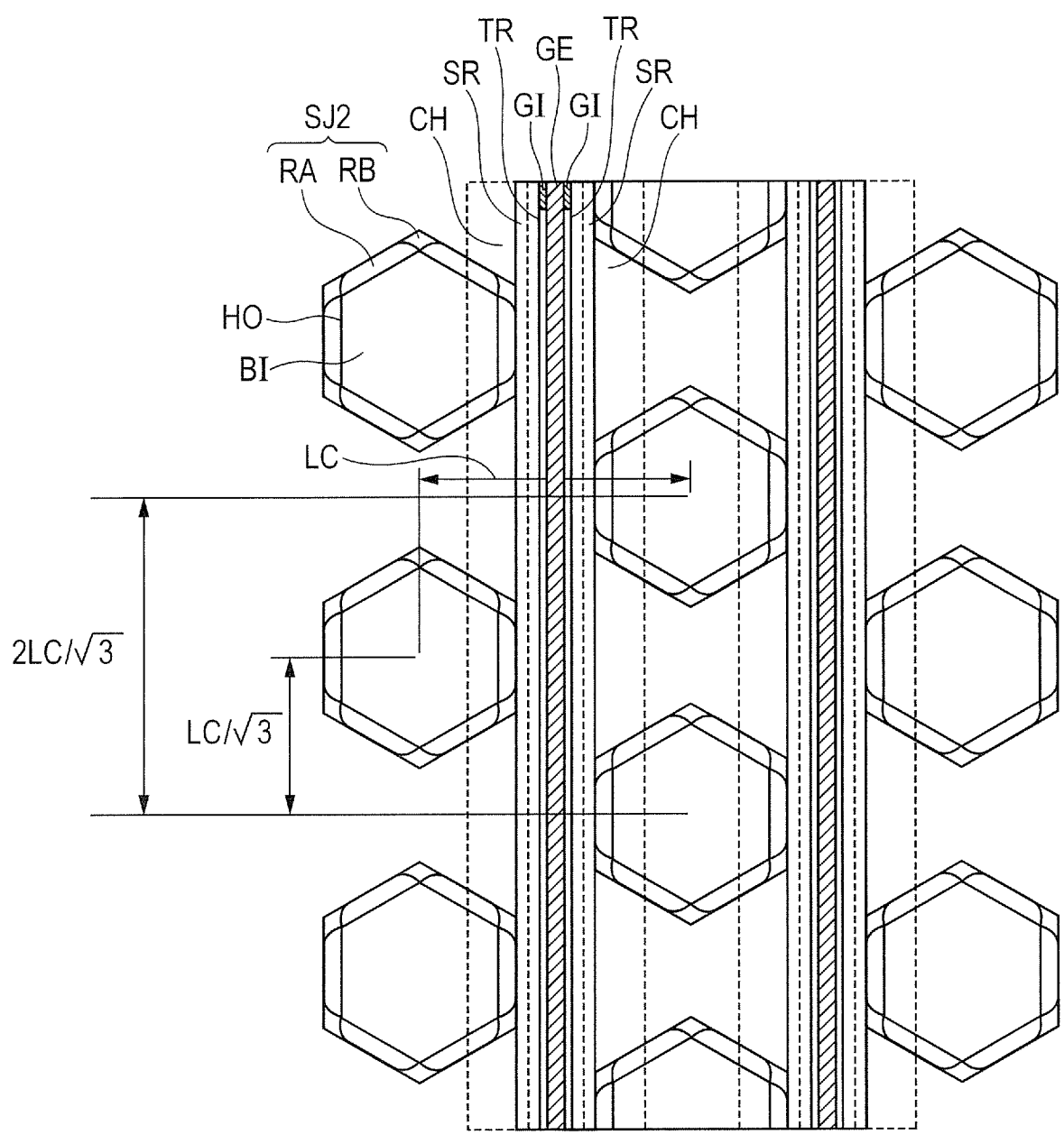
FIG. 43 is a diagram showing the structure of a semiconductor device in an eleventh embodiment, specifically, an enlarged plan view corresponding to FIG. 2.

As shown in FIG. 43, the structure of this embodiment, as will be seen by comparison, differs from the first embodiment in the planar shape of the hole portion HO and the planar layout of the hole portions HO. The planar shape of each hole portion HO in this embodiment is hexagonal. The hole portions HO are arranged in a staggered pattern $2/\sqrt{3}$ times as large as a hole pitch LC in the lateral direction.

Figure 44A:
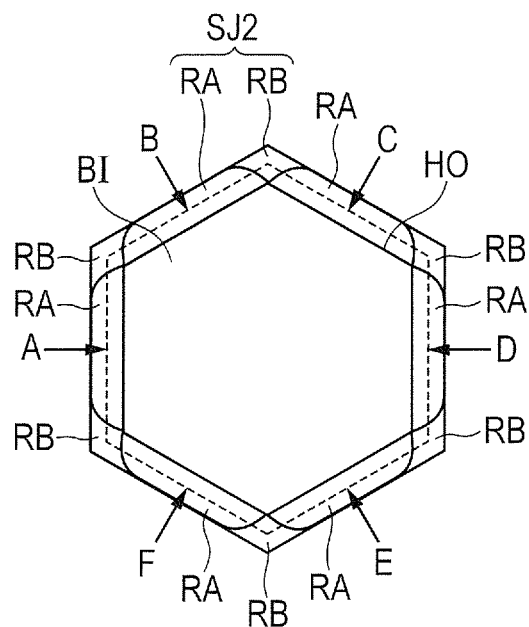
FIG. 44A shows the hole portion and a p-type region at the front surface of the semiconductor substrate in the eleventh embodiment.
Figure 44B:
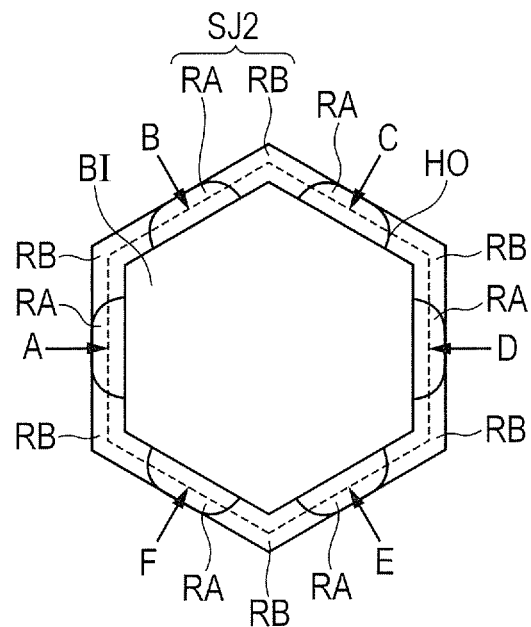
FIG. 44B shows the hole portion and the p-type region at the bottom surface of the hole portion.
Figure 45:
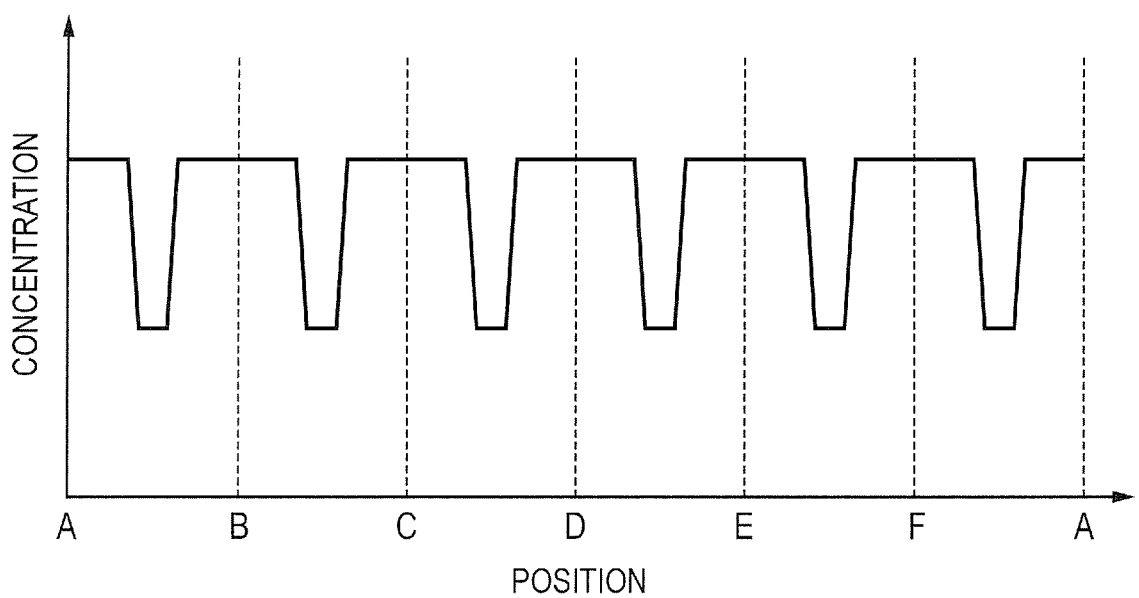
FIG. 45 shows an impurity concentration distribution along the dashed line in FIG. 44A.
Figure 46:
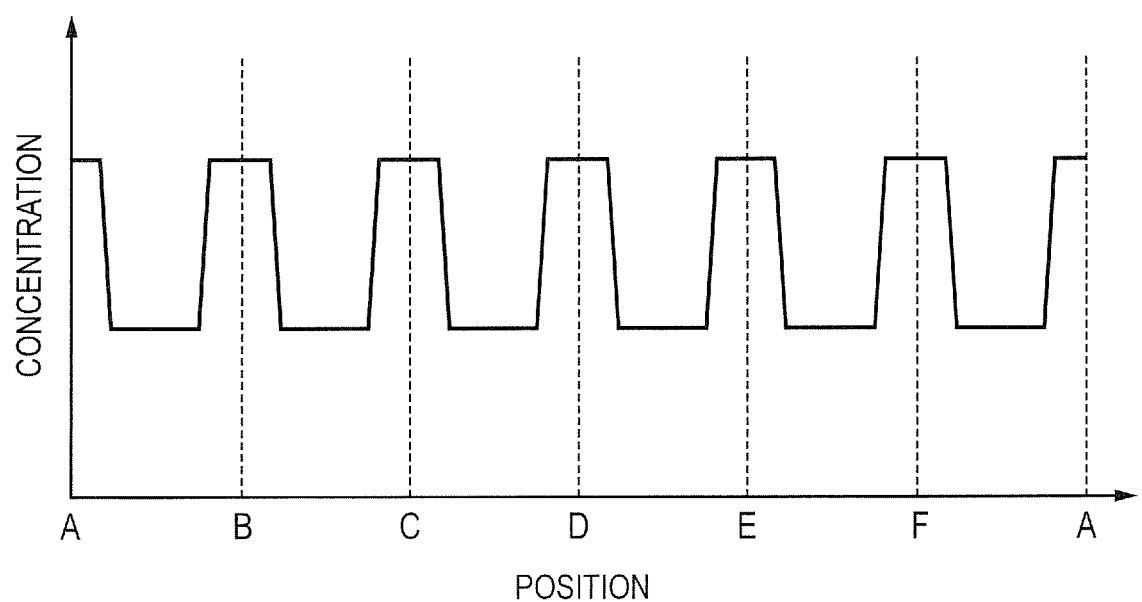
FIG. 46 shows an impurity concentration distribution along the dashed line in FIG. 44B.

As shown in FIGS. 44 to 46, each side (each side surface) of the hexagonal hole portion HO is provided with the high-concentration region RA and the low-concentration region RB. The state of the distribution of the high-concentration region RA and low-concentration region RB at each side (each side surface) is the same as that in the first embodiment.

In the manufacturing method of this embodiment, ion implantation is performed from the direction perpendicular to each side surface of the hexagonal shape in the planar view (ion implantation is performed six times in total.) Thus, the p-type regions SJ2, each including the high-concentration region RA and the low-concentration region RB, are formed as shown in FIGS. 43 to 46.

Note that the structure and manufacturing method in this embodiment are substantially the same as those in the first embodiment except for the above-mentioned points. The same components in this embodiment as those in the first embodiment are also designated by the same reference numerals as those used in the first embodiments, and thus a description thereof will not be repeated.

In this embodiment, the p-type impurity concentration in the high-concentration region RA, formed at each side surface of the hole portion HO, is made uniform, as compared to the first embodiment. Thus, the n-type region SJ1 can be depleted more uniformly, which can achieve a power MOSFET that exhibits a lower resistance even at the same breakdown voltage, like the sixth embodiment.

In this embodiment, the planar shape of each hole portion HO is hexagonal, the hole portions HO are arranged in a staggered pattern in the planar view, and the hole pitch in the longitudinal direction is substantially $2/\sqrt{3}$ times as large as the hole pitch in the lateral direction. Thus, the distances between one hole portion HO and six other hole portions HO located in the surroundings of the one hole portion are all equal. That is, lines coupling the center points of the respective hole portions HO form an equilateral triangle. In this way, the n-type regions SJ1 can be depleted uniformly. Thus, the n-type impurity concentration in the n-type regions SJ1 can be increased, compared with a structure having the same breakdown voltage, so that the power MOSFET with a lower on-resistance can be achieved.

The planar shape of each hole portion HO in this embodiment is hexagonal. Thus, the amounts of p-type impurities at the respective side surfaces of the hole portion HO can be made uniform, thereby making it possible to enhance the effect of expanding the depletion layer uniformly in the respective directions from each side surface of the hole portion HO.

Note that the effect of expanding the depletion layer uniformly in the respective directions from the side surfaces of the hole portion HO can be obtained to some extent even when the shape of the hole portion HO is quadrilateral, like the sixth embodiment.

Twelfth Embodiment

Figure 47:
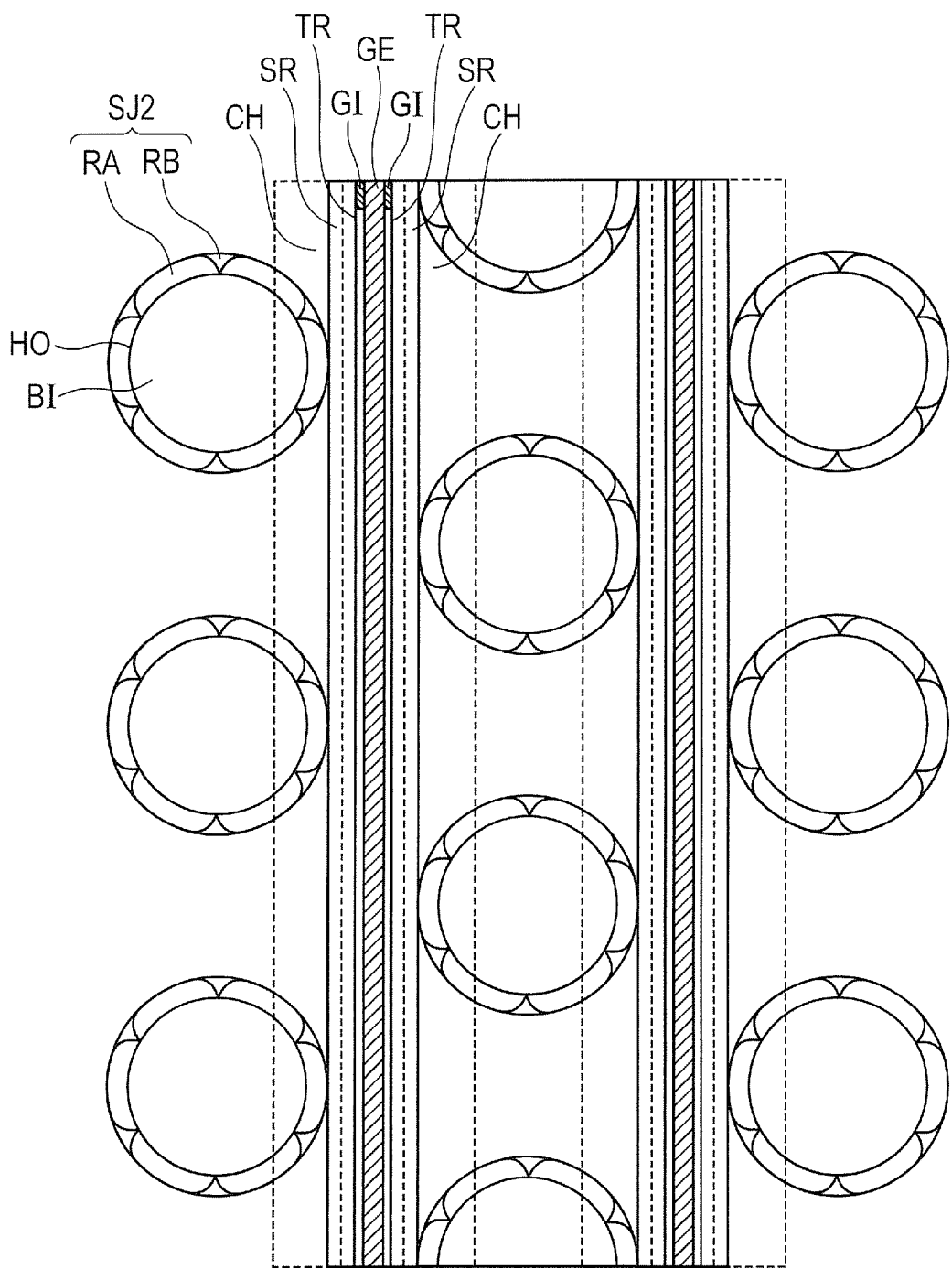
FIG. 47 is a diagram showing the structure of a semiconductor device in a twelfth embodiment, specifically, an enlarged plan view corresponding to FIG. 2.

As shown in FIG. 47, the structure of this embodiment, as will be seen by comparison, differs from the structure of the sixth embodiment in the planar shape of the hole portion HO. The planar shape of each hole portion HO in this embodiment is circle (for example, an exact circle).

Figure 48A:
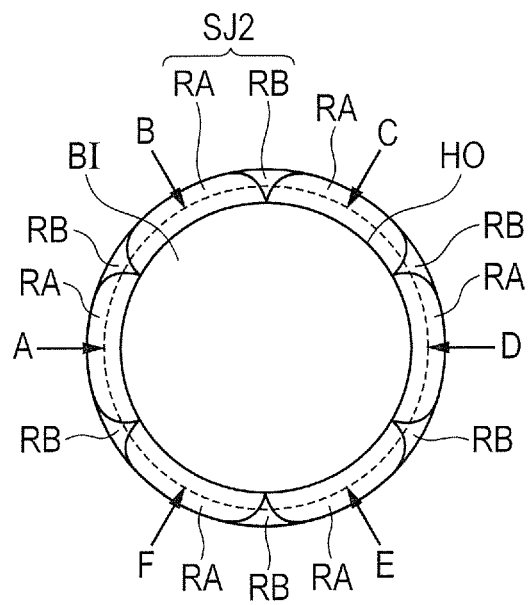
FIG. 48A shows the hole portion and a p-type region at the front surface of the semiconductor substrate in the twelfth embodiment.
Figure 48B:
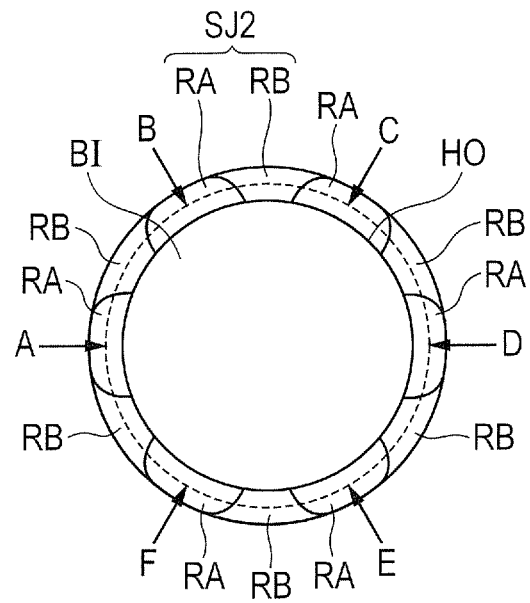
FIG. 48B shows the hole portion and the p-type region at the bottom surface of the hole portion.
Figure 49:
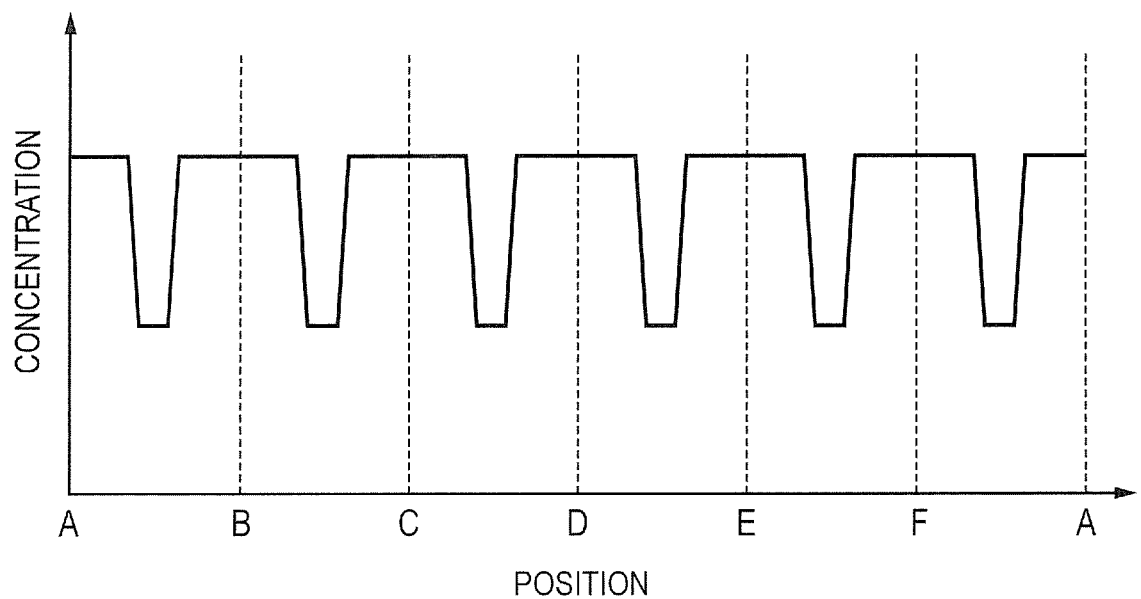
FIG. 49 shows an impurity concentration distribution along the dashed line in FIG. 48A.
Figure 50:
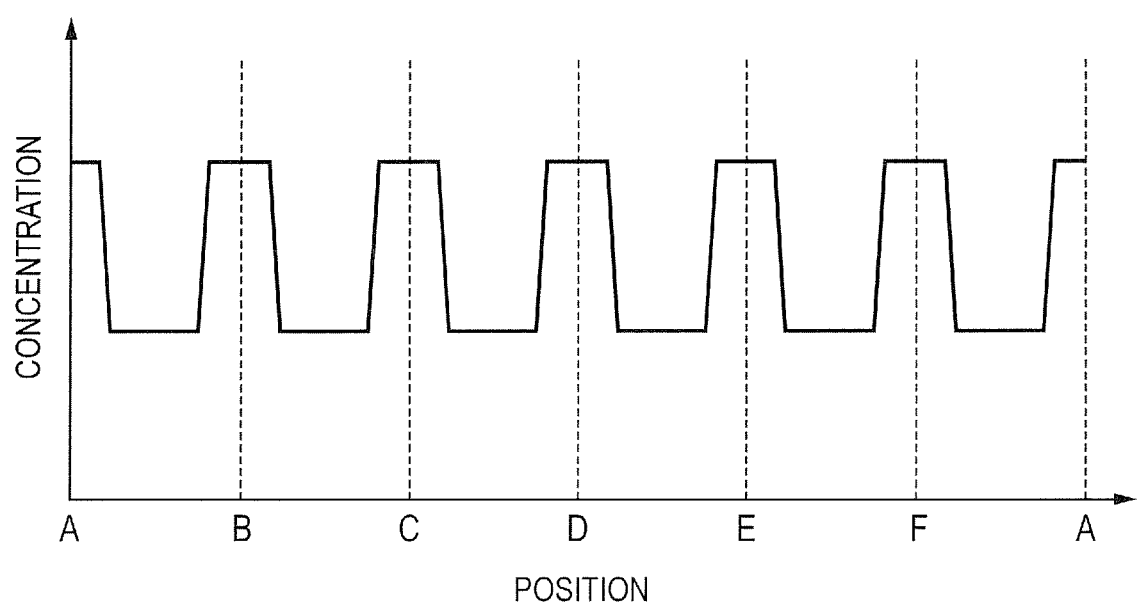
FIG. 50 shows an impurity concentration distribution along the dashed line in FIG. 48B.

As shown in FIGS. 48 to 50, the high-concentration regions RA and the low-concentration regions RB are formed in the surroundings of the circular hole portion HO in the planar view. The state of the distribution of the high-concentration region RA and low-concentration region RB is the same as that in the first embodiment.

In the manufacturing method of this embodiment, ion implantation is performed from the direction that deviates from the center of the circle, for example, by 60° in the planar view (ion implantation is performed six times in total.) Thus, the p-type regions SJ2, each including the high-concentration region RA and the low-concentration region RB, are formed as shown in FIGS. 47 to 50.

Note that the structure and manufacturing method in this embodiment are substantially the same as those in the sixth embodiment except for the above-mentioned points. The same components in this embodiment as those in the sixth embodiment are also designated by the same reference numerals used in the sixth embodiment, and thus a description thereof will not be repeated.

In this embodiment, as compared to the sixth embodiment, the planar shape of the hole portion HO is circular, thus increasing the flexibility in the ion implantation direction. For example, the number of the ion implantation directions for formation of the p-type region SJ2 is increased, thus enabling the improvement of the uniformity of the impurity amounts in the p-type regions SJ2 in the respective directions, thereby enhancing the effects of the ninth embodiment.

Furthermore, this embodiment can be combined with the tenth embodiment or eleventh embodiment.

Thirteenth Embodiment

Figure 51:
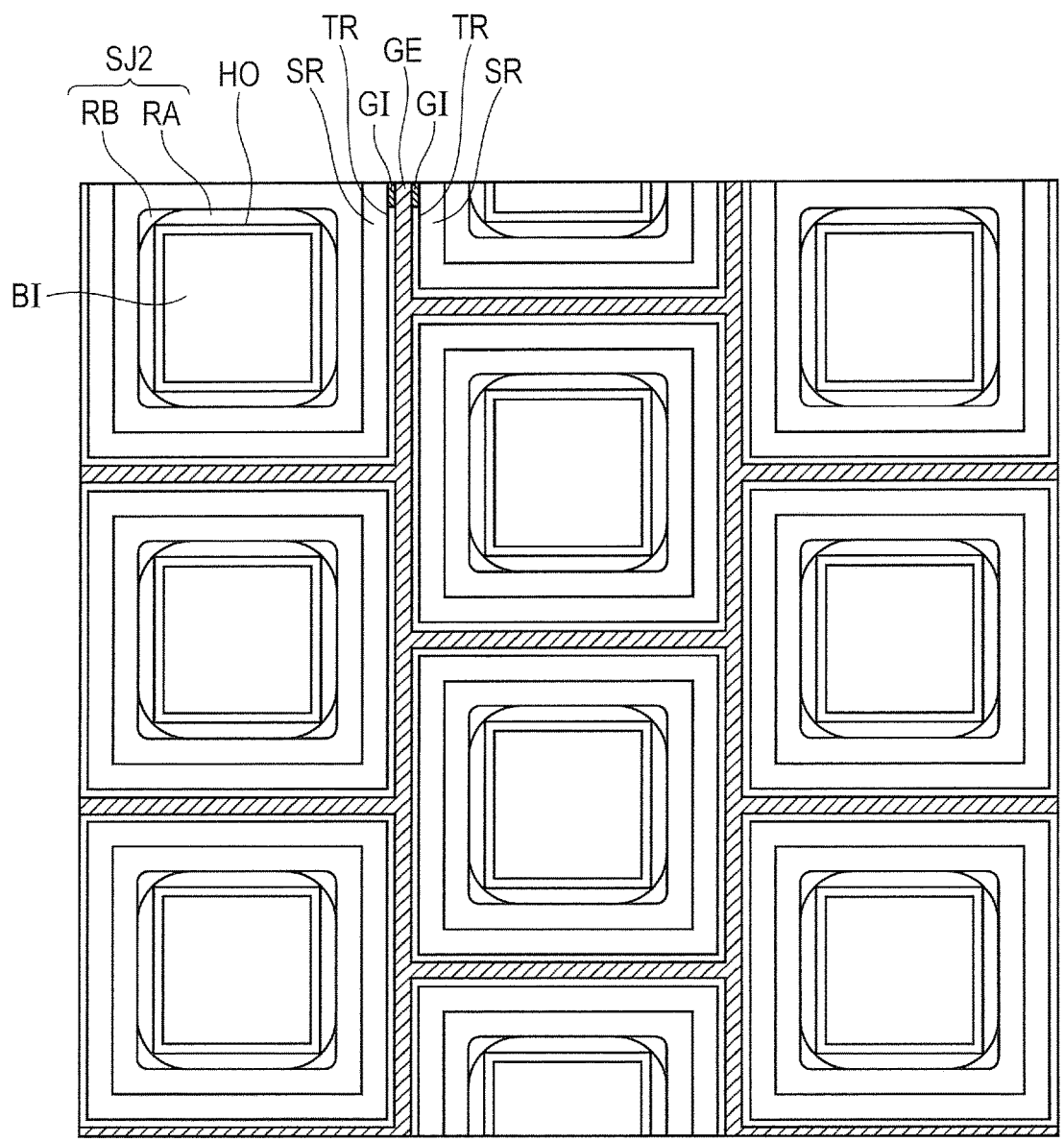
FIG. 51 is a diagram showing the structure of a semiconductor device in a thirteenth embodiment, specifically, an enlarged plan view corresponding to FIG. 2.

As shown in FIG. 51, the structure of this embodiment, as will be seen by comparison, differs from the structure of the sixth embodiment in the planar shape of the gate electrode GE. In this embodiment, the planar shape of the gate electrode GE has a quadrilateral mesh shape that surrounds each hole portion HO. Thus, each of the hole portions HO is surrounded by the gate electrode GE in the planar view. Furthermore, each of the hole portions HO is surrounded by the corresponding source region SR in the planar view.

Note that the structure and manufacturing method in this embodiment are substantially the same as those in the sixth embodiment except for the above-mentioned points. The same components in this embodiment as those in the sixth embodiment are also designated by the same reference numerals as those used in the sixth embodiment, and thus a description thereof will not be repeated.

In this embodiment, the width of the gate electrode GE is large, as compared to the sixth embodiment. Thus, components of parts of the conduction resistance of the power MOSFET, induced by the gate electrodes GE (channel resistance, source diffusion layer resistance, and the like), are reduced. In this way, the smaller conduction resistance can be obtained.

The planar layout of the gate electrodes in this embodiment can also be configured by a combination of the structures of the first to twelfth embodiments.

(Others)

The above-mentioned first to thirteenth embodiments have described above the power MOSFET formed as the element over the semiconductor substrate SUB. Alternatively, this element may be a diode shown in FIG. 52, or an insulated gate bipolar transistor (IGBT) shown in FIG. 53. Even when this element is either the diode shown in FIG. 52 or the IBGT shown in FIG. 53, the same effects as those in the first to thirteenth embodiments can be obtained.

Figure 52:
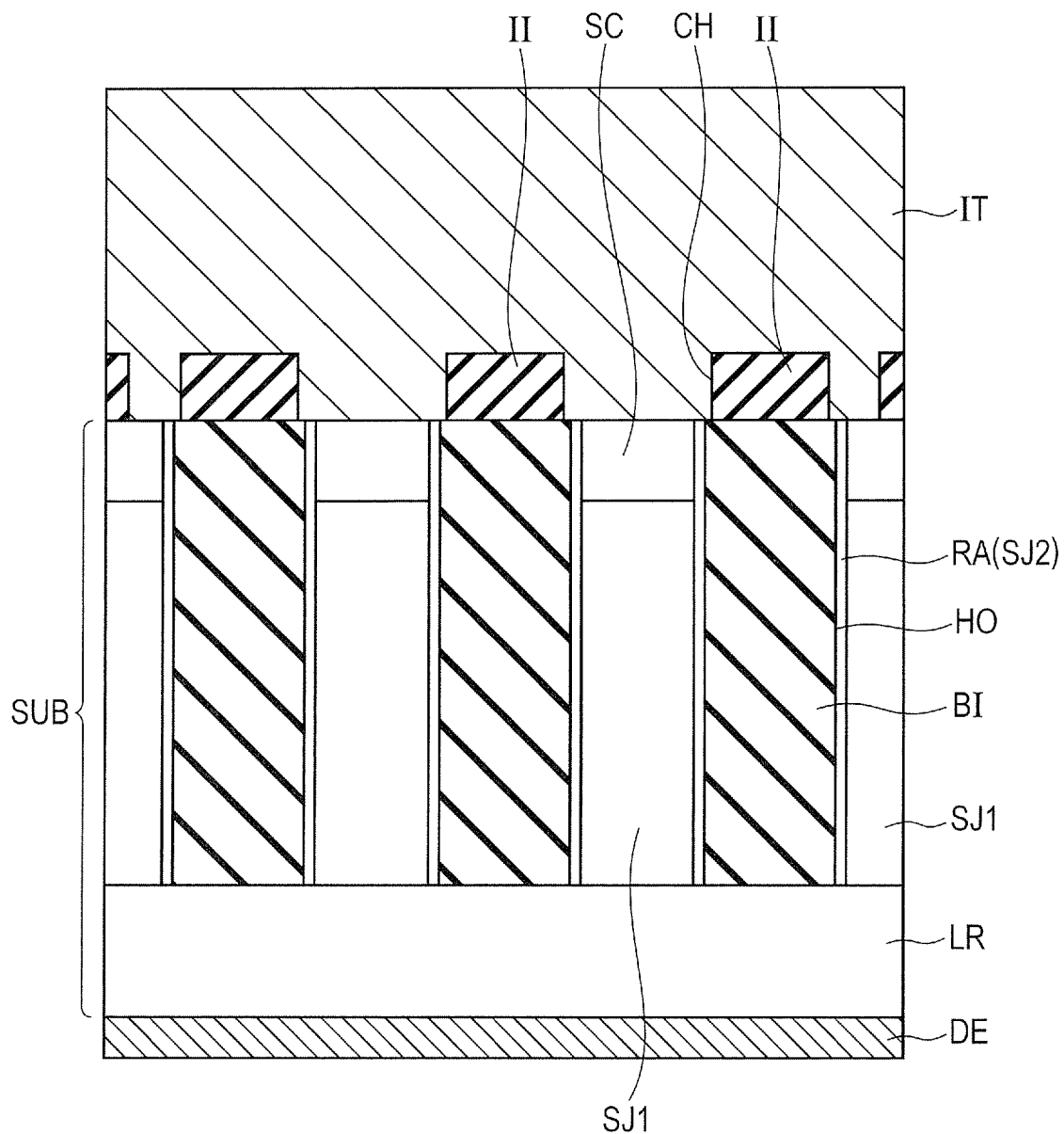
FIG. 52 is a schematic cross-sectional view corresponding to FIG. 3 and showing a structure in which the structure of the first embodiment is applied to a diode.

As shown in FIG. 52, the diode in this embodiment, as will be seen by comparison, differs from the structure of the power MOSFET in that the gate insulating film GI, gate electrode GE, and source region SR are omitted. Specifically, the diode includes an n⁻region LR, n-type regions (first impurity regions) SJ1, and p-type anode regions SC.

The n⁻region LR is a region with a low resistance and formed at the back surface S2 of the semiconductor substrate SUB. The n-type regions SJ1 are positioned on a side of the front surface S1 of the n⁻region LR and in contact with the n⁻region LR. Each of the p-type anode regions SC is positioned on the side of the front surface S1 in the corresponding n-type region SJ1 and forms p-n junction with the n-type region SJ1. The channel formation regions SC are positioned at the front surface S1 of the semiconductor substrate SUB.

The above-mentioned diode has a superjunction structure. The superjunction structure includes the above-mentioned n-type regions SJ1 and p-type regions (second impurity regions) SJ2.

The wiring layer (anode electrode) IT is electrically coupled to the anode regions SC through contact holes CH formed in the interlayer insulating film II. The cathode electrode DE is electrically coupled to the n⁻region LR.

Figure 53:
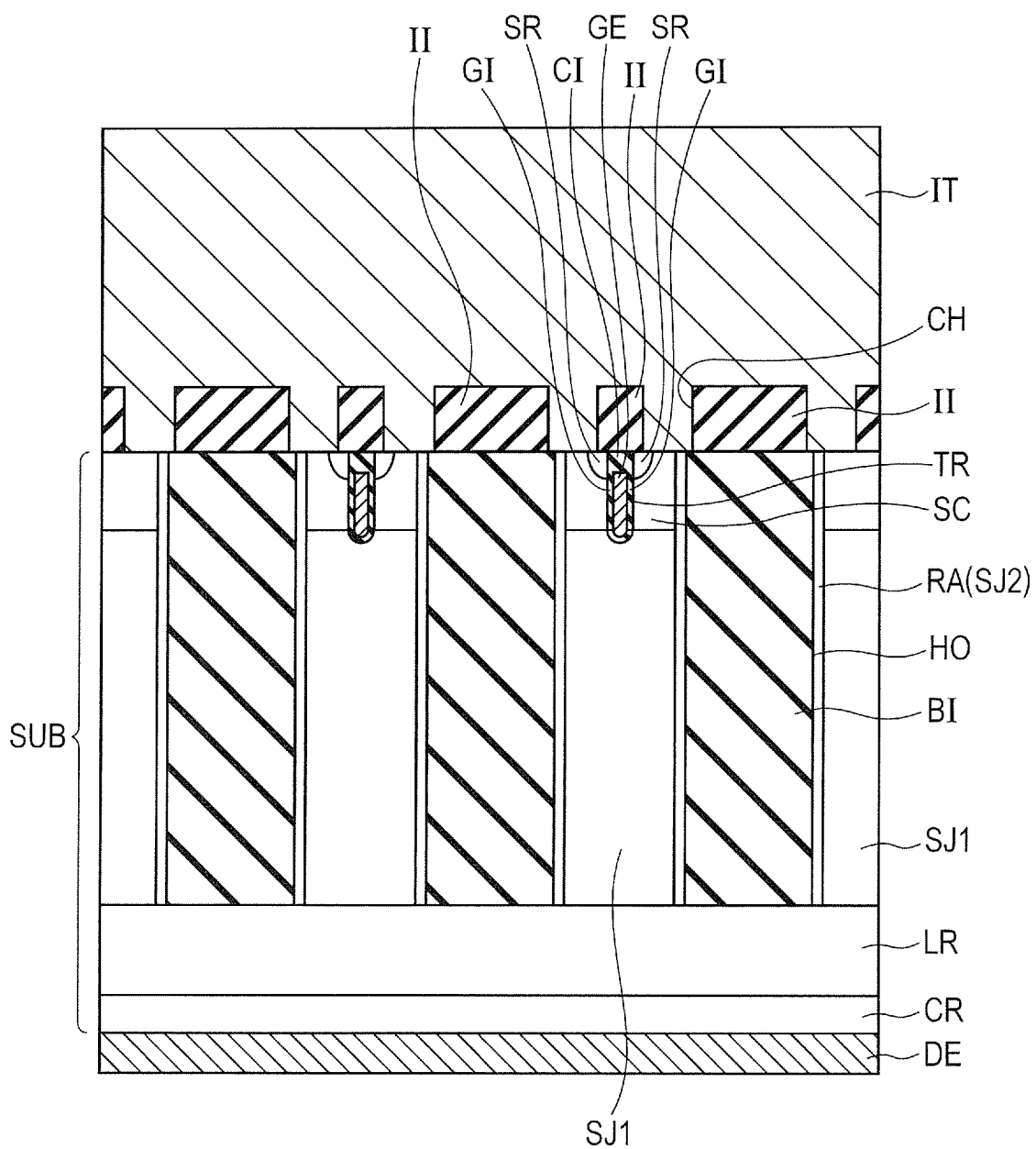
FIG. 53 is a schematic cross-sectional view corresponding to FIG. 3 and showing a structure in which the structure of the first embodiment is applied to an insulated gate bipolar transistor (IGBT).

As shown in FIG. 53, the IGBT in this embodiment, as will be seen by comparison, differs from the structure of the power MOSFET in that a p-type contact region CR is added. Specifically, the p-type contact region CR is disposed between the n⁻region LR and the collector electrode DE. Thus, the collector electrode DE is electrically coupled to the p-type collector region CR.

In the above-mentioned first to thirteenth embodiments, the trench-gate element (MOSFET, IGBT) have been described, but the element of the invention may be a planar-gate element.

The present invention made by the inventors has been specifically described above on the basis of the embodiments. It is apparent that the present invention is not limited to the embodiments described above, and that various modifications and changes can be made to the embodiments without departing from the spirit and scope of the invention.

What is claimed is:

1. A semiconductor device, comprising:
   a semiconductor substrate having a front surface and including a hole portion that extends from the front surface of the semiconductor substrate into the semiconductor substrate in a depth direction;
   a first impurity region of a first conductive type formed in the semiconductor substrate;
   a second impurity region of a second conductive type formed at a wall surface of the hole portion, the second impurity region forming p-n junction with the first impurity region, and
   a base region of the second conductive type formed in the front surface of the semiconductor substrate, the base region providing a channel region and being connected with a side surface of the hole portion,
   wherein the second impurity region comprises:
   a low-concentration region of the second conductive type formed at the wall surface of the hole portion; and
   a high-concentration region of the second conductive type formed at the wall surface of the hole portion and coupled to the low-concentration region, and
   wherein a width of the high-concentration region along the wall surface of the hole portion becomes smaller from the front surface of the semiconductor substrate toward a deeper position within the semiconductor substrate in the depth direction,
   wherein the high-concentration region extends an entire length of the hole portion and contacts a bottom surface of the hole portion.

2. The semiconductor device according to claim 1, wherein the hole portion has a polygonal shape in a planar view.

3. The semiconductor device according to claim 2, wherein the high-concentration region has a width positioned over an entire one side of the hole portion at the front surface, and a width positioned over a part of the one side of the hole portion at the bottom surface of the hole portion.

4. The semiconductor device according to claim 1, wherein the hole portion has a square shape in a planar view.

5. The semiconductor device according to claim 1, wherein the hole portion has a rectangular shape in a planar view.

6. The semiconductor device according to claim 5, wherein a long side of the rectangular shape of the hole portion at the front surface has a dimension that is 5.6 times or less as large as a depth of the hole portion.

7. The semiconductor device according to claim 1, wherein a planar occupied area of the hole portion becomes smaller from the front surface toward a deeper position.

* * * * *